(12) United States Patent
Hahn et al.

(10) Patent No.: US 9,551,763 B1
(45) Date of Patent: Jan. 24, 2017

(54) DIAMOND NITROGEN VACANCY SENSOR WITH COMMON RF AND MAGNETIC FIELDS GENERATOR

(71) Applicant: Lockheed Martin Corporation, Bethesda, MD (US)

(72) Inventors: Joseph W. Hahn, Erial, NJ (US); Gregory S. Bruce, Abington, PA (US); Duc Huynh, Princeton Junction, NJ (US); Wilbur Lew, Mount Laurel, NJ (US)

(73) Assignee: LOCKHEED MARTIN CORPORATION, Bethesda, MD (US)

( * ) Notice: Subject to any disclaimer, the term of this patent is extended or adjusted under 35 U.S.C. 154(b) by 0 days.

(21) Appl. No.: 15/003,298

(22) Filed: Jan. 21, 2016

(51) Int. Cl.
*G01R 33/02* (2006.01)
*G01R 33/032* (2006.01)
*G01R 33/00* (2006.01)

(52) U.S. Cl.
CPC ......... *G01R 33/032* (2013.01); *G01R 33/0017* (2013.01)

(58) Field of Classification Search
CPC .................................................. G01R 33/02
USPC ...................................................... 324/244.1
See application file for complete search history.

(56) References Cited

U.S. PATENT DOCUMENTS

| | | |
|---|---|---|
| 2,746,027 A | 5/1956 | Murray |
| 3,389,333 A | 6/1968 | Wolff et al. |
| 3,514,723 A | 5/1970 | Cutler |
| 3,518,531 A | 6/1970 | Huggett |
| 3,745,452 A | 7/1973 | Osburn et al. |
| 3,899,758 A | 8/1975 | Maier et al. |
| 4,078,247 A | 3/1978 | Albrecht |
| 4,084,215 A | 4/1978 | Willenbrock |
| 4,329,173 A | 5/1982 | Culling |
| 4,368,430 A | 1/1983 | Dale et al. |
| 4,514,083 A | 4/1985 | Fukuoka |
| 4,588,993 A | 5/1986 | Babij et al. |
| 4,638,324 A | 1/1987 | Hannan |
| 4,675,522 A | 6/1987 | Arunkumar |
| 4,945,305 A | 7/1990 | Blood |
| 5,019,721 A | 5/1991 | Martens et al. |
| 5,038,103 A | 8/1991 | Scarzello et al. |
| 5,113,136 A | 5/1992 | Hayashi et al. |
| 5,134,369 A | 7/1992 | Lo et al. |
| 5,189,368 A | 2/1993 | Chase |
| 5,245,347 A | 9/1993 | Bonta et al. |
| 5,252,912 A | 10/1993 | Merritt et al. |
| 5,301,096 A | 4/1994 | Klontz et al. |

(Continued)

FOREIGN PATENT DOCUMENTS

| | | |
|---|---|---|
| DE | 69608006 T2 | 2/2001 |
| DE | 19600241 C2 | 8/2002 |

(Continued)

OTHER PUBLICATIONS

"'Diamond Sensors, Detectors, and Quantum Devices' in Patent Application Approval Process," Chemicals & Chemistry (Feb. 28, 2014).

(Continued)

*Primary Examiner* — Bot Ledynh
(74) *Attorney, Agent, or Firm* — Foley & Lardner LLP

(57) ABSTRACT

Systems and apparatuses are disclosed for providing a uniform RF field and magnetic bias field to a nitrogen vacancy center diamond.

21 Claims, 21 Drawing Sheets

(56) References Cited

U.S. PATENT DOCUMENTS

| | | |
|---|---|---|
| 5,384,109 A | 1/1995 | Klaveness et al. |
| 5,396,802 A | 3/1995 | Moss |
| 5,568,516 A | 10/1996 | Strohallen et al. |
| 5,694,375 A | 12/1997 | Woodall |
| 5,818,352 A | 10/1998 | McClure |
| 5,907,420 A | 5/1999 | Chraplyvy et al. |
| 6,057,684 A | 5/2000 | Murakami et al. |
| 6,124,862 A | 9/2000 | Boyken et al. |
| 6,130,753 A | 10/2000 | Hopkins et al. |
| 6,195,231 B1 | 2/2001 | Sedlmayr et al. |
| 6,360,173 B1 | 3/2002 | Fullerton |
| 6,398,155 B1 | 6/2002 | Hepner et al. |
| 6,433,944 B1 | 8/2002 | Nagao et al. |
| 6,504,365 B2 | 1/2003 | Kitamura |
| 6,542,242 B1 | 4/2003 | Yost et al. |
| 6,636,146 B1 | 10/2003 | Wehoski |
| 6,686,696 B2 | 2/2004 | Mearini et al. |
| 6,690,162 B1 | 2/2004 | Schopohl et al. |
| 7,118,657 B2 | 10/2006 | Golovchenko et al. |
| 7,221,164 B1 | 5/2007 | Barringer |
| 7,277,161 B2 | 10/2007 | Claus |
| 7,305,869 B1 | 12/2007 | Berman et al. |
| 7,307,416 B2 | 12/2007 | Islam et al. |
| RE40,343 E | 5/2008 | Anderson |
| 7,413,011 B1 | 8/2008 | Chee et al. |
| 7,427,525 B2 | 9/2008 | Santori et al. |
| 7,448,548 B1 | 11/2008 | Compton |
| 7,471,805 B2 | 12/2008 | Goldberg |
| 7,474,090 B2 | 1/2009 | Islam et al. |
| 7,543,780 B1 | 6/2009 | Marshall et al. |
| 7,546,000 B2 | 6/2009 | Spillane et al. |
| 7,983,812 B2 | 7/2011 | Potter |
| 8,120,351 B2 | 2/2012 | Rettig et al. |
| 8,120,355 B1 | 2/2012 | Stetson |
| 8,138,756 B2 | 3/2012 | Barclay et al. |
| 8,294,306 B2 | 10/2012 | Kumar et al. |
| 8,311,767 B1 * | 11/2012 | Stetson .......... 702/152 |
| 8,334,690 B2 | 12/2012 | Kitching et al. |
| 8,415,640 B2 | 4/2013 | Babinec et al. |
| 8,471,137 B2 | 6/2013 | Adair et al. |
| 8,480,653 B2 | 7/2013 | Birchard et al. |
| 8,525,516 B2 | 9/2013 | Le Prado et al. |
| 8,547,090 B2 | 10/2013 | Lukin et al. |
| 8,574,536 B2 | 11/2013 | Boudou et al. |
| 8,575,929 B1 | 11/2013 | Wiegert |
| 8,686,377 B2 | 4/2014 | Twitchen et al. |
| 8,758,509 B2 | 6/2014 | Twitchen et al. |
| 8,803,513 B2 | 8/2014 | Hosek et al. |
| 8,885,301 B1 | 11/2014 | Heidmann |
| 8,913,900 B2 | 12/2014 | Lukin et al. |
| 8,947,080 B2 * | 2/2015 | Lukin et al. ......... 324/244.1 |
| 9,157,859 B2 | 10/2015 | Walsworth et al. |
| 2002/0167306 A1 | 11/2002 | Zalunardo et al. |
| 2003/0058346 A1 | 3/2003 | Bechtel et al. |
| 2003/0076229 A1 | 4/2003 | Blanpain et al. |
| 2003/0235136 A1 | 12/2003 | Akselrod et al. |
| 2004/0013180 A1 | 1/2004 | Giannakis et al. |
| 2004/0022179 A1 | 2/2004 | Giannakis et al. |
| 2004/0042150 A1 | 3/2004 | Swinbanks et al. |
| 2004/0109328 A1 | 6/2004 | Dahl et al. |
| 2004/0247145 A1 | 12/2004 | Luo et al. |
| 2005/0099177 A1 | 5/2005 | Greelish |
| 2005/0126905 A1 | 6/2005 | Golovchenko et al. |
| 2005/0130601 A1 | 6/2005 | Palermo et al. |
| 2005/0134257 A1 | 6/2005 | Etherington et al. |
| 2005/0146327 A1 | 7/2005 | Jakab |
| 2006/0054789 A1 | 3/2006 | Miyamoto et al. |
| 2006/0062084 A1 | 3/2006 | Drew |
| 2006/0071709 A1 | 4/2006 | Maloberti et al. |
| 2007/0004371 A1 | 1/2007 | Okanobu |
| 2007/0247147 A1 | 10/2007 | Xiang et al. |
| 2008/0016677 A1 | 1/2008 | Creighton |
| 2008/0048640 A1 | 2/2008 | Hull et al. |
| 2008/0078233 A1 | 4/2008 | Larson et al. |
| 2008/0089367 A1 | 4/2008 | Srinivasan et al. |
| 2008/0204004 A1 | 8/2008 | Anderson |
| 2008/0217516 A1 | 9/2008 | Suzuki et al. |
| 2008/0239265 A1 | 10/2008 | Den Boef |
| 2008/0299904 A1 | 12/2008 | Yi et al. |
| 2009/0042592 A1 | 2/2009 | Cho et al. |
| 2009/0060790 A1 | 3/2009 | Okaguchi et al. |
| 2009/0079426 A1 | 3/2009 | Anderson |
| 2009/0132100 A1 | 5/2009 | Shibata |
| 2009/0277702 A1 | 11/2009 | Kanada et al. |
| 2009/0310650 A1 | 12/2009 | Chester et al. |
| 2010/0045269 A1 | 2/2010 | Lafranchise et al. |
| 2010/0134922 A1 | 6/2010 | Yamada et al. |
| 2010/0157305 A1 | 6/2010 | Henderson |
| 2010/0188081 A1 | 7/2010 | Lammegger |
| 2010/0237149 A1 | 9/2010 | Olmstead |
| 2010/0271016 A1 * | 10/2010 | Barclay et al. ......... 324/244.1 |
| 2010/0308813 A1 | 12/2010 | Lukin et al. |
| 2010/0315079 A1 | 12/2010 | Lukin et al. |
| 2010/0326042 A1 | 12/2010 | McLean et al. |
| 2011/0034393 A1 | 2/2011 | Justen et al. |
| 2011/0062957 A1 | 3/2011 | Fu et al. |
| 2011/0063957 A1 | 3/2011 | Isshiki et al. |
| 2011/0066379 A1 | 3/2011 | Mes |
| 2011/0127999 A1 | 6/2011 | Lott et al. |
| 2011/0165862 A1 | 7/2011 | Yu et al. |
| 2011/0243267 A1 | 10/2011 | Won et al. |
| 2012/0016538 A1 | 1/2012 | Waite et al. |
| 2012/0019242 A1 | 1/2012 | Hollenberg et al. |
| 2012/0037803 A1 | 2/2012 | Strickland |
| 2012/0044014 A1 | 2/2012 | Stratakos et al. |
| 2012/0051996 A1 | 3/2012 | Scarsbrook et al. |
| 2012/0063505 A1 | 3/2012 | Okamura et al. |
| 2012/0087449 A1 | 4/2012 | Ling et al. |
| 2012/0140219 A1 | 6/2012 | Cleary |
| 2012/0181020 A1 | 7/2012 | Barron et al. |
| 2012/0194068 A1 | 8/2012 | Cheng et al. |
| 2012/0257683 A1 | 10/2012 | Schwager et al. |
| 2012/0281843 A1 | 11/2012 | Christensen et al. |
| 2012/0326793 A1 | 12/2012 | Gan |
| 2013/0127518 A1 | 5/2013 | Nakao |
| 2013/0215712 A1 | 8/2013 | Geiser et al. |
| 2013/0265782 A1 | 10/2013 | Barrena et al. |
| 2014/0012505 A1 | 1/2014 | Smith |
| 2014/0037932 A1 | 2/2014 | Twitchen et al. |
| 2014/0061510 A1 | 3/2014 | Twitchen et al. |
| 2014/0072008 A1 | 3/2014 | Faraon et al. |
| 2014/0077231 A1 | 3/2014 | Twitchen et al. |
| 2014/0081592 A1 | 3/2014 | Bellusci et al. |
| 2014/0104008 A1 | 4/2014 | Gan |
| 2014/0126334 A1 | 5/2014 | Megdal et al. |
| 2014/0139322 A1 | 5/2014 | Wang et al. |
| 2014/0166904 A1 | 6/2014 | Walsworth et al. |
| 2014/0167759 A1 | 6/2014 | Pines et al. |
| 2014/0168174 A1 | 6/2014 | Idzik et al. |
| 2014/0191139 A1 | 7/2014 | Englund |
| 2014/0191752 A1 | 7/2014 | Walsworth et al. |
| 2014/0198463 A1 | 7/2014 | Klein |
| 2014/0215985 A1 | 8/2014 | Pollklas |
| 2014/0247094 A1 | 9/2014 | Englund et al. |
| 2014/0272119 A1 | 9/2014 | Kushalappa et al. |
| 2014/0273826 A1 | 9/2014 | Want et al. |
| 2014/0306707 A1 | 10/2014 | Walsworth et al. |
| 2014/0327439 A1 | 11/2014 | Cappellaro et al. |
| 2014/0335339 A1 | 11/2014 | Dhillon et al. |
| 2014/0340085 A1 | 11/2014 | Cappellaro et al. |
| 2014/0368191 A1 | 12/2014 | Goroshevskiy et al. |
| 2015/0001422 A1 | 1/2015 | Englund et al. |
| 2015/0009746 A1 | 1/2015 | Kucsko et al. |
| 2015/0018018 A1 | 1/2015 | Shen et al. |
| 2015/0048822 A1 | 2/2015 | Walsworth et al. |
| 2015/0054355 A1 | 2/2015 | Ben-Shalom et al. |
| 2015/0090033 A1 | 4/2015 | Budker et al. |
| 2015/0128431 A1 | 5/2015 | Kuo |
| 2015/0137793 A1 | 5/2015 | Englund et al. |
| 2015/0192532 A1 | 7/2015 | Clevenson et al. |
| 2015/0192596 A1 | 7/2015 | Englund et al. |
| 2015/0225052 A1 | 8/2015 | Cordell |
| 2015/0235661 A1 | 8/2015 | Heidmann |
| 2015/0253355 A1 | 9/2015 | Grinolds et al. |

(56) References Cited

U.S. PATENT DOCUMENTS

| | | |
|---|---|---|
| 2015/0268373 A1 | 9/2015 | Meyer |
| 2015/0269957 A1* | 9/2015 | El Hallak et al. ............ 360/88 |
| 2015/0276897 A1 | 10/2015 | Leussler et al. |
| 2015/0299894 A1 | 10/2015 | Markham et al. |
| 2015/0374250 A1 | 12/2015 | Hatano et al. |

FOREIGN PATENT DOCUMENTS

| | | |
|---|---|---|
| DE | 10228536 A1 | 1/2003 |
| EP | 0 161 940 B1 | 12/1990 |
| EP | 0 718 642 | 6/1996 |
| EP | 0 726 458 | 8/1996 |
| EP | 1 505 627 | 2/2005 |
| EP | 1 990 313 | 11/2008 |
| EP | 2 163 392 | 3/2010 |
| EP | 2 495 166 A1 | 9/2012 |
| EP | 2 587 232 A1 | 5/2013 |
| EP | 2 705 179 | 3/2014 |
| EP | 2 707 523 | 3/2014 |
| EP | 2 837 930 | 2/2015 |
| EP | 2 907 792 | 8/2015 |
| GB | 2 433 737 | 7/2007 |
| GB | 2 482 596 | 2/2012 |
| GB | 2 483 767 | 3/2012 |
| GB | 2 486 794 | 6/2012 |
| GB | 2 490 589 | 11/2012 |
| GB | 2 491 936 | 12/2012 |
| GB | 2 493 236 | 1/2013 |
| GB | 2 495 632 A | 4/2013 |
| GB | 2 497 660 | 6/2013 |
| GB | 2 510 053 A | 7/2014 |
| GB | 2 515 226 | 12/2014 |
| GB | 2 522 309 | 7/2015 |
| GB | 2 526 639 | 12/2015 |
| JP | 3782147 B2 | 6/2006 |
| JP | 4800896 B2 | 10/2011 |
| JP | 2012-103171 | 5/2012 |
| JP | 2012-110489 | 6/2012 |
| JP | 2012-121748 | 6/2012 |
| JP | 2013-028497 | 2/2013 |
| JP | 5476206 B2 | 4/2014 |
| JP | 5522606 B2 | 6/2014 |
| JP | 5536056 B2 | 7/2014 |
| JP | 5601183 B2 | 10/2014 |
| JP | 2014-215985 | 11/2014 |
| JP | 2014-216596 | 11/2014 |
| JP | 2015-518562 A | 7/2015 |
| JP | 5764059 B2 | 8/2015 |
| JP | 2015-167176 | 9/2015 |
| JP | 2015-529328 | 10/2015 |
| JP | 5828036 B2 | 12/2015 |
| JP | 5831947 B2 | 12/2015 |
| WO | WO-87/04028 A1 | 7/1987 |
| WO | WO-88/04032 A1 | 6/1988 |
| WO | WO-95/33972 A1 | 12/1995 |
| WO | WO-2011/046403 A2 | 4/2011 |
| WO | WO-2011/153339 | 12/2011 |
| WO | WO-2012/016977 A2 | 2/2012 |
| WO | WO-2012/084750 | 6/2012 |
| WO | WO-2013/066446 A1 | 5/2013 |
| WO | WO-2013/066448 | 5/2013 |
| WO | WO-2013/093136 A1 | 6/2013 |
| WO | WO-2013/188732 A1 | 12/2013 |
| WO | WO-2014/099110 A2 | 6/2014 |
| WO | WO-2014/135544 A1 | 9/2014 |
| WO | WO-2014/135547 A1 | 9/2014 |
| WO | WO-2014/166883 A1 | 10/2014 |
| WO | WO-2014/210486 A1 | 12/2014 |
| WO | WO-2015/015172 A1 | 2/2015 |
| WO | WO-2015/158383 A1 | 10/2015 |
| WO | WO-2015/193156 A1 | 12/2015 |

OTHER PUBLICATIONS

"Findings from University of Stuttgart in physics reported," Physics Week (Jul. 7, 2009).
"New Findings on Nitrogen from Ecole Normale Superieure Summarized (Magnetic imaging with an ensemble of nitrogen vacancy-centers in diamond)," Physics Week (Jul. 21, 2015).
"Patent Issued for Diamond Sensors, Detectors, and Quantum Devices (U.S. Pat. No. 9,249,526)," Journal of Engineering (Feb. 15, 2016).
"Researchers Submit Patent Application, 'Diamond Sensors, Detectors, and Quantum Devices', for Approval," Chemicals & Chemistry (Apr. 11, 2014).
Acosta, "Optical Magnetometry with Nitrogen-Vacancy Centers in Diamond," University of California Berkeley, 2011.
Acosta, et al., "Diamonds with a high density of nitrogen-vacancy centers for magnetometry applications," Physical Review B, Sep. 2009.
Acosta, et al., "Nitrogen-vacancy centers: physics and applications," MRS Bulletin, 2013.
Aiello, et al., "Composite-pulse magnetometry with a solid-state quantum sensor," Nature Communications, Jan. 2013.
Alam, "Solid-state C-13 magic angle spinning NMR spectroscopy characterization of particle size structural variations in synthetic nanodiamonds," Materials Chemistry and Physics, Jun. 2004.
Albrecht, et al., "Coupling of nitrogen vacancy centres in nanodiamonds by means of phonons," New Journal of Physics, Aug. 2013.
Anthony, et al., "Jahn-Teller Splitting and Zeeman Effect of Acceptors in Diamond," 20th International Conference on Defects in Semiconductors, Jul. 1999.
Appel, et al., "Nanoscale microwave imaging with a single electron spin in diamond," New Journal of Physics, Nov. 2015.
Arai, et al., "Fourier magnetic imaging with nanoscale resolution and compressed sensing speed-up using electronic spins in diamond," Nature Nanotechnology, Oct. 2015.
Aslam, et al., "Single spin optically detected magnetic resonance with 60-90 GHz (E-band) microwave resonators," Review of Scientific Instruments, Jun. 2015.
Awschalom, et al., "Diamond age of spintronics," Scientific American, Oct. 2007.
Babamoradi, et al., "Correlation between entanglement and spin density in nitrogen-vacancy center of diamond," European Physical Journal D, Dec. 2011.
Babunts, et al., "Diagnostics of NV defect structure orientation in diamond using optically detected magnetic resonance with a modulated magnetic field," Technical Physics Letters, Jun. 2015.
Babunts, et al., "Temperature-scanned magnetic resonance and the evidence of two-way transfer of a nitrogen nuclear spin hyperfine interaction in coupled NV-N pairs in diamond," JETP Letters, Jun. 2012.
Bagguley, et al., "Zeeman effect of acceptor states in semiconducting diamond," Journal of the Physical Society of Japan, 1966.
Balasubramanian, et al., "Nanoscale imaging magnetometry with diamond spins under ambient conditions," Nature, Oct. 2008.
Balmer, et al., "Chemical Vapour deposition synthetic diamond: materials technology and applications," J. of Physics, 2009.
Baranov, et al., "Enormously High Concentrations of Fluorescent Nitrogen-Vacancy Centers Fabricated by Sintering of Detonation Nanodiamonds," Small, Jun. 2011.
Barfuss, et al., "Strong mechanical driving of a single electron spin," Nature Physics, Oct. 2015.
Bennett, et al., "CVD Diamond for High Power Laser Applications," Proceedings of SPIE, Jan. 2013.
Berman & Chernobrod, "Single-spin microscope with sub-nanoscale resolution based on optically detected magnetic resonance," Proceedings of SPIE, May 2010.
Berman, et al. "Measurement of single electron and nuclear spin states based on optically detected magnetic resonance," J. Physics: Conf. Series 38: 167-170 (2006).
Blakley, et al., "Room-temperature magnetic gradiometry with fiber-coupled nitrogen-vacancy centers in diamond," Optics Letters, Aug. 2015.

(56) References Cited

OTHER PUBLICATIONS

Bourgeois, et al., "Photoelectric detection of electron spin resonance of nitrogen-vacancy centres in diamond," Nature Communications, Oct. 2015.
Budker & Kimball, "Optical Magnetometry," Cambridge Press, 2013.
Budker & Romalis, "Optical Magnetometry," Nature Physics, 2007.
Casanova, et al., "Effect of magnetic field on phosphorus centre in diamond," Physica Status Solidi A, Jul. 2001.
Castelletto, et al., "Frontiers in diffraction unlimited optical methods for spin manipulation, magnetic field sensing and imaging using diamond nitrogen vacancy defects," Nanophotonics, 2012.
Chapman, et al., "Anomalous saturation effects due to optical spin depolarization in nitrogen-vacancy centers in diamond nanocrystals," Physical Review B, Jul. 2012.
Chen, et al., "Vector magnetic field sensing by a single nitrogen vacancy center in diamond," EPL, Mar. 2013.
Chernobrod, et al., "Improving the sensitivity of frequency modulation spectroscopy using nanomechanical cantilevers," Applied Physics Letters, 2004.
Chernobrod, et al., "Spin Microscope Based on Optically Detected Magnetic Resonance," Journal of Applied Physics, 2005.
Childress, et al., "Coherent dynamics of coupled electron and nuclear spin qubits in diamond," Science, 2006.
Chipaux, et al., "Magnetic imaging with an ensemble of nitrogen vacancy-centers in diamond," European Physical Journal D, Jul. 2015.
Chipaux, et al., "Nitrogen vacancies (NV) centers in diamond for magnetic sensors and quantum sensing," Proceedings of SPIE, Jan. 2015.
Chipaux, et al., "Wide bandwidth instantaneous radio frequency spectrum analyzer based on nitrogen vacancy centers in diamond," Applied Physics Letters, Dec. 2015.
Clevenson, et al., "Broadband magnetometry and temperature sensing with a light-trapping diamond waveguide," Nature Physics, May 2015.
Cooper, et al., " Time-resolved magnetic sensing with electronic spins in diamond," Nature Communications, Jan. 2014.
Creedon, et al., "Strong coupling between P1 diamond impurity centers and a three-dimensional lumped photonic microwave cavity," Physical Review B, Apr. 2015.
Davies, "Current problems in diamond: towards a quantitative understanding," Physica B—Condensed Matter, Dec. 1999.
De Lange, et al., "Single-Spin Magnetometry with Multipulse Sensing Sequences," Physical Review Letters, Feb. 2011.
Degen, "Scanning magnetic field microscope with a diamond single-spin sensor ," Applied Physics Letters, 2008.
Delacroix, et al., "Design, manufacturing, and performance analysis of mid-infrared achromatic half-wave plates with diamond subwavelength gratings," Applied Optics, 2012.
Denatale, et al., "Fabrication and characterization of diamond moth eye antireflective surfaces on Ge," J. of Applied Physics, 1982.
Dobrovitski, et al., "Quantum Control over Single Spins in Diamond," Annual Review of Condensed Matter Physics vol. 4, 2013.
Doherty, et al., "The nitrogen-vacancy colour centre in diamond," Physics Reports, Jul. 2013.
Doherty, et al., "Theory of the ground-state spin of the NV-center in diamond," Physical Review B, May 2012.
Doi, et al., "Pure negatively charged state of the NV center in n-type diamond," Physical Review B, Feb. 2016.
Drake, et al., "Influence of magnetic field alignment and defect concentration on nitrogen-vacancy polarization in diamond," New Journal of Physics, Jan. 2016.
Dreau, et al., "Avoiding power broadening in optically detected magnetic resonance of single NV defects for enhanced dc magnetic field sensitivity," Physical Review B, Nov. 2011.
Dreau, et al., "High-resolution spectroscopy of single NV defects coupled with nearby C-13 nuclear spins in diamond," Physical Review B, Apr. 2012.
Dumeige, et al., "Magnetometry with nitrogen-vacancy ensembles in diamond based on infrared absorption in a doubly resonant optical cavity," Physical Review B, Apr. 2013.
Epstein, et al., "Anisotropic interactions of a single spin and dark-spin spectroscopy in diamond," Center for Spintronics and Quantum Computation, 2005.
Fedotov, et al., "High-resolution magnetic field imaging with a nitrogen-vacancy diamond sensor integrated with a photonic-crystal fiber," Optics Letters, Feb. 2016.
Fedotov, et al., "Photonic-crystal-fiber-coupled photoluminescence interrogation of nitrogen vacancies in diamond nanoparticles," Laser Physics Letters, Feb. 2012.
Feng & Wei, "A steady-state spectral method to fit microwave absorptions of NV centers in diamonds: application to sensitive magnetic field sensing," Measurement Science & Technology, Oct. 2014.
Freitas, et al., "Solid-State Nuclear Magnetic Resonance (NMR) Methods Applied to the Study of Carbon Materials," Chemistry and Physics of Carbon, vol. 31, 2012.
Geiselmann, et al., "Fast optical modulation of the fluorescence from a single nitrogen-vacancy centre," Nature Physics, Dec. 2013.
Gombert & Blasi, "The Moth-Eye Effect-From Fundamentals to Commercial Exploitation," Functional Properties of Bio-Inspired Surfaces, Nov. 2009.
Gong, et al., "Generation of Nitrogen-Vacancy Center Pairs in Bulk Diamond by Molecular Nitrogen Implantation," Chinese Physics Letters, Feb. 2016.
Gould, et al., "An imaging magnetometer for bio-sensing based on nitrogen-vacancy centers in diamond," Proceedings of the SPIE—Progress in Biomedical Optics and Imaging, 2014.
Gould, et al., "Room-temperature detection of a single 19 nm super-paramagnetic nanoparticle with an imaging magnetometer," Applied Physics Letters, Aug. 2014.
Gruber, et al., "Scanning confocal optical microscopy and magnetic resonance on single defect centers," Science, Jun. 1997.
Haeberle, et al., "Nanoscale nuclear magnetic imaging with chemical contrast," Nature Nanotechnology, Feb. 2015.
Haihua, et al., "Design of wideband anti-reflective sub wavelength nanostructures," Infrared and Laser Engineering, 2011.
Hall, et al., "Sensing of Fluctuating Nanoscale Magnetic Fields Using Nitrogen-Vacancy Centers in Diamond," Physical Review Letters, Nov. 2009.
Hanson, et al., "Coherent Dynamics of a single spin interacting with an adjustable spin bath," Sci. Am. Ass'n for the Advancement of Science, 2008.
Hanson, et al., "Polarization and Readout of Coupled Single Spins in Diamond," Physical Review Letters, 2006.
Hanson, et al., "Room-temperature manipulation and decoherence of a single spin in diamond," Physical Review, 2006.
Hanzawa, et al., "Zeeman effect on the zero-phonon line of the NV center in synthetic diamond," Physica B, Feb. 1993.
Hegyi & Yablonovitch, "Molecular imaging by optically detected electron spin resonance of nitrogen-vacancies in nanodiamonds," Nano Letters, Mar. 2013.
Hegyi & Yablonovitch, "Nanodiamond molecular imaging with enhanced contrast and expanded field of view," Journal of Biomedical Optics, Jan. 2014.
Hilser, et al., "All-optical control of the spin state in the NV-center in diamond," Physical Review B, Sep. 2012.
Hobbs, "Study of the Environmental and Optical Durability of AR Microstructures in Sapphire, ALON, and Diamond," Proceedings of SPIE, 2009.
Huebener, et al., "ODMR of NV centers in nano-diamonds covered with N@C60," Physica Status Solidi B, Oct. 2008.
Huxter, et al., "Vibrational and electronic dynamics of nitrogen-vacancy centres in diamond revealed by two-dimensional ultrafast spectroscopy," Nature Physics, Nov. 2013.
Ivady, et al., "Pressure and temperature dependence of the zero-field splitting in the ground state of NV centers in diamond: A first-principles study," Physical Review B, Dec. 2014.
Jarmola, et al., "Temperature- and Magnetic-Field-Dependent Longitudinal Spin Relaxation in Nitrogen-Vacancy Ensembles in Diamond," Physical Review Letters, May 2012.

(56) References Cited

OTHER PUBLICATIONS

Jensen, et al., "Light narrowing of magnetic resonances in ensembles of nitrogen-vacancy centers in diamond," Physical Review, Jan. 2013.
Kailath, "Linear Systems," Prentice Hall, 1979.
Karlsson, et al., "Diamond micro-optics: microlenses and antireflection structures surfaces for the infrared spectral region," Optics Express, 2003.
Khan & Hemmer, "Noise limitation in nano-scale imaging," Proceedings of SPIE, Dec. 2005.
Kim, et al., "Electron spin resonance shift and linewidth broadening of nitrogen-vacancy centers in diamond as a function of electron irradiation dose," Applied Physics Letters, Aug. 2012.
Kim, et al., "Magnetospectroscopy of acceptors in 'blue' diamonds," Physica B, Aug. 2001.
Kim, et al., "Zeeman effect of electronic Raman lines of accepters in elemental semiconductors: Boron in blue diamond," Physical Review B, Sep. 2000.
King, et al., "Optical polarization of 13C nuclei in diamond through nitrogen vacancy centers," Physical Review B, Feb. 2010.
Kok, et al., "Materials Science: Qubits in the pink," Nature, 2006.
Konenko, et al., "Formation of antireflective surface structures on diamond films by laser patterning," Applied Physics A, 1999.
Kraus, et al., "Magnetic field and temperature sensing with atomic-scale spin defects in silicon carbide," Scientific Reports, Jul. 2014.
Lai, et al., "Influence of a static magnetic field on the photoluminescence of an ensemble of nitrogen-vacancy color centers in a diamond single-crystal," Applied Physics Letters, Sep. 2009.
Lai, et al., "Optically detected magnetic resonance of a single Nitrogen-Vacancy electronic spin in diamond nanocrystals," CLEO/EQEC, 2009.
Laraoui, et al., "Nitrogen-vacancy-assisted magnetometry of paramagnetic centers in an individual diamond nanocrystal," Nano Letters, Jul. 2012.
Lazariev, et al., "A nitrogen-vacancy spin based molecular structure microscope using multiplexed projection reconstruction," Scientific Reports, Sep. 2015.
Lee, et al., "Vector magnetometry based on S=3/2 electronic spins," Physical Review B, Sep. 2015.
Lesik, et al., "Preferential orientation of NV defects in CVD diamond films grown on (113)-oriented substrates," Diamond and Related Materials, Jun. 2015.
Levchenko, et al., "Inhomogeneous broadening of optically detected magnetic resonance of the ensembles of nitrogen-vacancy centers in diamond by interstitial carbon atoms," Applied Physics Letters, Mar. 2015.
Liu, et al., "Electron spin studies of nitrogen vacancy centers in nanodiamonds," Acta Physica Sinica, Aug. 2013.
Liu, et al., "Fiber-integrated diamond-based magnetometer," Applied Physics Letters, Sep. 2013.
MacLaurin, et al., "Nanoscale magnetometry through quantum control of nitrogen-vacancy centres in rotationally diffusing nanodiamonds," New Journal of Physics, Jan. 2013.
Macs, et al., "Diamond as a magnetic field calibration probe," Journal of Physics D: Applied Physics, Apr. 2004.
Maletinsky, et al., "A robust scanning diamond sensor for nanoscale imaging with single nitrogen-vacancy centres," Nature Nanotechnology, May 2012.
Mamin, et al., "Multipulse Double-Quantum Magnetometry with Near-Surface Nitrogen-Vacancy Centers," Physical Review Letters, Jul. 2014.
Mamin, et al., "Nanoscale Nuclear Magnetic Resonance with a Nitrogen-Vacancy Spin Sensor," Science, Feb. 2013.
Manson, et al., "GR transitions in diamond: magnetic field measurements," Journal of Physics C, Nov. 1980.
Massachusetts Institute of Technology; "Wide-Field Imaging Using Nitrogen Vacancies" in Patent Application Approval Process, Physics Week (2015).
Matsuda, et al., "Development of a plastic diamond anvil cell for high pressure magneto-photoluminescence in pulsed high magnetic fields," International Journal of Modern Physics B, Nov. 2004.
Maze et al., "Nanoscale magnetic sensing with an individual electronic spin in diamond," Nature Physics (2008).
Maze, et al., "Nanoscale magnetic sensing using spin qubits in diamond," Nature Physics, 2009.
Meijer, et al., "Generation of single color centers by focused nitrogen implantation," Applied Physics Letters, Dec. 2005.
Millot, et al., "High-field Zeeman and paschen-back effects at high pressure in oriented ruby," Physical Review B, Oct. 2008.
Moriyama, et al., "Importance of electron-electron interactions and Zeeman splitting in single-wall carbon nanotube quantum dots," Physica E, Feb. 2005.
Mrozek, et al., "Circularly polarized microwaves for magnetic resonance study in the GHz range: Application to nitrogen-vacancy in diamonds," Applied Physics Letters, Jul. 2015.
Nagl, et al., "Improving surface and defect center chemistry of fluorescent nanodiamonds for imaging purposes—a review," Analytical and Bioanalaytical Chemistry, Oct. 2015.
Neumann, et al., "Excited-state spectroscopy of single NV defects in diamond using optically detected magnetic resonance," New Journal of Physics, Jan. 2009.
Nizovtsev, et al., "Modeling fluorescence of single nitrogen-vacancy defect centers in diamond," Physica B—Condensed Matter, Dec. 2001.
Nizovtsev, et al., "Theoretical study of hyperfine interactions and optically detected magnetic resonance spectra by simulation of the C-291(NV)H--(172) diamond cluster hosting nitrogen-vacancy center," New Journal of Physics, Aug. 2014.
Nowodzinski, et al., "Nitrogen-Vacancy centers in diamond for current imaging at the redistributive layer level of Integrated Circuits," Microelectronics Reliability, Aug. 2015.
Nusran, et al., "Optimizing phase-estimation algorithms for diamond spin magnetometry," Physical Review B, Jul. 2014.
Ohashi, et al., "Negatively Charged Nitrogen-Vacancy Centers in a 5 nm Thin C-12 Diamond Film," Nano Letters, Oct. 2013.
Plakhotnik, et al., "Super-Paramagnetic Particles Chemically Bound to Luminescent Diamond : Single Nanocrystals Probed with Optically Detected Magnetic Resonance," Journal of Physical Chemistry C, Aug. 2015.
Rabeau, et al., "Implantation of labelled single nitrogen vacancy centers in diamond using N-15," Applied Physics Letters, Jan. 2006.
Ranjbar, et al., "Many-electron states of nitrogen-vacancy centers in diamond and spin density calculations," Physical Review B, Oct. 2011.
Reynhardt, "Spin-lattice relaxation of spin-½nuclei in solids containing diluted paramagnetic impurity centers. I. Zeeman polarization of nuclear spin system," Concepts in Magnetic Resonance Part A, Sep. 2003.
Rogers, et al., "Singlet levels of the NV(−)centre in diamond," New Journal of Physics, Jan. 2015.
Rondin, et al., "Magnetometry with nitrogen-vacancy defects in diamond," Reports on Progress in Physics, May 2014.
Rondin, et al., "Nanoscale magnetic field mapping with a single spin scanning probe magnetometer," Applied Physics Letters, Apr. 2012.
Sarkar, et al., "Magnetic properties of graphite oxide and reduced graphene oxide," Physica E, 2014.
Scheuer, et al., "Accelerated 2D magnetic resonance spectroscopy of single spins using matrix completion," Scientific Reports, Dec. 2015.
Schirhagl, et al., "Nitrogen-vacancy centers in diamond: Nanoscale sensors for physics and biology," Annual Review of Physical Chemistry, Jan. 2014.
Schoenfeld & Harneit, "Real time magnetic field sensing and imaging using a single spin in diamond," Physical Review Letters, Jan. 2011.
Sedov, et al., "Si-doped nano- and microcrystalline diamond films with controlled bright photoluminescence of silicon-vacancy color centers," Diamond and Related Materials, Jun. 2015.
Shames, et al., "Magnetic resonance tracking of fluorescent nanodiamond fabrication," Journal of Physics D: Applied Physics, Apr. 2015.

(56) References Cited

OTHER PUBLICATIONS

Simanovskaia, et al., "Sidebands in optically detected magnetic resonance signals of nitrogen vacancy centers in diamond," Physical Review B, Jun. 2013.
Sotoma, et al., "Effective production of fluorescent nanodiamonds containing negatively-charged nitrogen-vacancy centers by ion irradiation," Diamond and Related Materials, Oct. 2014.
Steiner, et al., "Universal enhancement of the optical readout fidelity of single electron spins at nitrogen-vacancy centers in diamond," Physical Review B, Jan. 2010.
Steinert et al., "High-sensitivity magnetic imaging using an array of spins in diamond," Rev. Sci. Inst. (2010).
Steinert, et al., "High sensitivity magnetic imaging using an array of spins in diamond," Review of Scientific Instruments, Apr. 2010.
Stepanov, et al., "High-frequency and high-field optically detected magnetic resonance of nitrogen-vacancy centers in diamond," Applied Physics Letters, Feb. 2015.
Sternschulte, et al., "Uniaxial stress and Zeeman splitting of the 1.681 eV optical center in a homoepitaxial CVD diamond film," Diamond and Related Materials, Sep. 1995.
Storteboom, et al., "Lifetime investigation of single nitrogen vacancy centres in nanodiamonds," Optics Express, May 2015.
Tahara, et al., "Quantifying selective alignment of ensemble nitrogen-vacancy centers in (111) diamond," Applied Physics Letters, Nov. 2015.
Taylor, et al., "High-sensitivity diamond magnetometer with nanoscale resolution," Nature Physics, Oct. 2008.
Terblanche, et al., "13C spin-lattice relaxation in natural diamond: Zeeman relaxation in fields of 500 to 5000 G at 300 K due to fixed paramagnetic nitrogen defects," Solid State Nuclear Magnetic Resonance, May 2001.
Tetienne, et al., "Magnetic-field-dependent photodynamics of single NV defects in diamond: an application to qualitative all-optical magnetic imaging," New Journal of Physics, Oct. 2012.
Tong, et al., "A hybrid-system approach for W state and cluster state generation," Optics Communication 310: 166-172 (2014).
Uhlen, et al., "New Diamond Nanofabrication process for hard x-ray zone plates," J. of Vacuum Science & Tech. B, 2011.
Vershovskii & Dmitriev, "Combined excitation of an optically detected magnetic resonance in nitrogen-vacancy centers in diamond for precision measurement of the components of a magnetic field vector," Technical Physics Letters, Nov. 2015.
Vershovskii & Dmitriev, "Micro-scale three-component quantum magnetometer based on nitrogen-vacancy color centers in diamond crystal," Technical Physics Letters, Apr. 2015.
Wang, et al., "Optimizing ultrasensitive single electron magnetometer based on nitrogen-vacancy center in diamond," Chinese Science Bulletin, Aug. 2013.
Webber, et al., "Ab initio thermodynamics calculation of the relative concentration of NV- and NV0 defects in diamond," Physical Review B, Jan. 2012.
Wolf, et al., "Subpicotesla Diamond Magnetometry," Physical Review X, Oct. 2015.
Wolfe, et al., "Off-resonant manipulation of spins in diamond via precessing magnetization of a proximal ferromagnet," Physical Review B, May 2014.
Xue & Liu, "Producing GHZ state of nitrogen-vacancy centers in cavity QED," Journal of Modern Optics, Mar. 2013.
Yavkin, et al., "Defects in Nanodiamonds: Application of High-Frequency cw and Pulse EPR, ODMR," Applied Magnetic Resonance, Oct. 2014.
Yu, et al., "Bright fluorescent nanodiamonds: no photobleaching and low cytotoxicity," J. Am. Chem. Soc., 2005.
Zhang, et al., "Laser-polarization-dependent and magnetically controlled optical bistability in diamond nitrogen-vacancy centers," Physics Letters A, Nov. 2013.
Zhang, et al., "Laser-polarization-dependent spontaneous emission of the zero phonon line from single nitrogen-vacancy center in diamond," Chinese Physics B, Apr. 2014.
Zhang, et al., "Scalable quantum information transfer between nitrogen-vacancy-center ensembles," Annals of Physics, Apr. 2015.
Zhao, et al., "Atomic-scale magnetometry of distant nuclear spin clusters via nitrogen-vacancy spin in diamond," Nature Nanotechnology, Apr. 2011.
Acosta et al., "Broadband magnetometry by infrared-absorption detection of nitrogen-vacancy ensembles in diamond," Appl. Phys. Letters 97: 174104 (Oct. 29, 2010), 4 pages.
Barry et al., "Optical magnetic detection of single-neuron action potentials using quantum defects in diamond," as submitted to Quantum Physics on Feb. 2, 2016, 23 pages.
Constable, "Geomagnetic Spectrum, Temporal." In Encyclopedia of Geomagnetism and Paleomagnetism, pp. 353-355, Springer: Dordrecht, Netherlands (2007).
International Search Report and Written Opinion of the International Searching Authority dated Apr. 1, 2016 from related PCT application PCT/US2016/014384, 12 pages.
International Search Report and Written Opinion of the International Searching Authority dated Apr. 11, 2016 from related PCT application PCT/US2016/014376, 12 pages.
International Search Report and Written Opinion of the International Searching Authority dated Apr. 11, 2016 from related PCT application PCT/US2016/014388, 14 pages.
International Search Report and Written Opinion of the International Searching Authority dated Apr. 11, 2016 from related PCT application PCT/US2016/014395, 15 pages.
International Search Report and Written Opinion of the International Searching Authority dated Jul. 6, 2015, from related PCT application PCT/US2015/021093, 9 pages.
International Search Report and Written Opinion of the International Searching Authority dated Jul. 8, 2015, from related PCT application PCT/US2015/024265, 11 pages.
International Search Report and Written Opinion of the International Searching Authority dated Jul. 12, 2016, from related PCT application PCT/US2016/014287, 14 pages.
International Search Report and Written Opinion of the International Searching Authority dated Jul. 16, 2015, from related PCT application PCT/US2015/24723, 8 pages.
International Search Report and Written Opinion of the International Searching Authority dated Jun. 10, 2016 from related PCT application PCT/US2016/014290, 11 pages.
International Search Report and Written Opinion of the International Searching Authority dated Jun. 2, 2016, from related PCT application PCT/US2016/014386, 14 pages.
International Search Report and Written Opinion of the International Searching Authority dated Jun. 2, 2016, from related PCT application PCT/US2016/014387, 13 pages.
International Search Report and Written Opinion of the International Searching Authority dated Jun. 6, 2016, from related PCT application PCT/US2016/014291, 13 pages.
International Search Report and Written Opinion of the International Searching Authority dated Jun. 9, 2016 from related PCT application PCT/US2016/014333, 16 pages.
International Search Report and Written Opinion of the International Searching Authority dated Mar. 24, 2016 from related PCT application PCT/US2016/014336, 17 pages.
International Search Report and Written Opinion of the International Searching Authority dated Mar. 24, 2016 from related PCT application PCT/US2016/014297, 15 pages.
International Search Report and Written Opinion of the International Searching Authority dated Mar. 24, 2016 from related PCT application PCT/US2016/014392, 8 pages.
International Search Report and Written Opinion of the International Searching Authority dated Mar. 24, 2016 from related PCT application PCT/US2016/014403, 10 pages.
International Search Report and Written Opinion of the International Searching Authority dated Mar. 25, 2016, from related PCT application PCT/US2016/014363, 8 pages.
International Search Report and Written Opinion of the International Searching Authority dated Mar. 25, 2016, from related PCT application PCT/US2016/014389, 19 pages.

(56) References Cited

OTHER PUBLICATIONS

International Search Report and Written Opinion of the International Searching Authority dated Mar. 28, 2016, from related PCT application PCT/US2016/014380, 9 pages.
International Search Report and Written Opinion of the International Searching Authority dated Mar. 28, 2016, from related PCT application PCT/US2016/014394, 17 pages.
International Search Report and Written Opinion of the International Searching Authority dated Mar. 29, 2016 from related PCT application PCT/US2016/014325, 11 pages.
International Search Report and Written Opinion of the International Searching Authority dated Mar. 29, 2016 from related PCT application PCT/US2016/014330, 8 pages.
International Search Report and Written Opinion of the International Searching Authority dated Mar. 29, 2016, from related PCT application PCT/US2016/014328, 7 pages.
International Search Report and Written Opinion of the International Searching Authority dated Mar. 29, 2016, from related PCT application PCT/US2016/014385, 11 pages.
International Search Report and Written Opinion of the International Searching Authority dated Mar. 30, 2016 from related PCT application PCT/US2016/014298, 14 pages.
International Search Report and Written Opinion of the International Searching Authority dated Mar. 31, 2016 from related PCT application PCT/US2016/014375, 11 pages.
International Search Report and Written Opinion of the International Searching Authority dated Mar. 31, 2016 from related PCT application PCT/US2016/014396, 11 pages.
International Search Report and Written Opinion of the International Searching Authority dated May 26, 2016, 2016 from related PCT application PCT/US2016/014331, 15 pages.
Le Sage et al., "Efficient photon detection from color centers in a diamond optical waveguide," Phys. Rev. B 85: 121202(R), pp. 121202-1-121202-4, (Mar. 23, 2012).
MacQuarie et al., "Mechanical spin control of nitrogen-vacancy centers in diamond," Retrieved from http://www.arxiv.org/pdf/1306.6356.pdf, pp. 1-8, (Jun. 2013).
Nobauer et al., "Smooth optimal quantum control for robust solid state spin magnetometry," Retrieved from http://www.arxiv.org/abs/1412.5051, pp. 1-12, (Dec. 2014).
Polatomic. "AN/ASQ-233A Digital Magnetic Anomaly Detecting Set." Retrieved May 9, 2016, from http://polatomic.com/images/DMAD_Data_Sheet_09-2009.pdf (2009), 1 page.
Poole, "What is GMSK Modulation—Gaussian Minimum Shift Keying." Radio-Electronics, retrieved from https://web.archive.org/web/20150403045840/http://www.radio-electronics.com/info/rf-technology-design/pm-phase-modulation/what-is-gmsk-gaussian-minimum-shift-keyingtutorial.php (Apr. 3, 2015), 4 pages.

Shao et al., "Diamond Color Center Based FM Microwave Demodulator," in Conference on Lasers and Electro-Optics, OSA Technical Digest (online) (Optical Society of America), paper JTh2A.136, 2 pages. (Jun. 5-10, 2016).
US Notice of Allowance dated Apr. 20, 2016, from related U.S. Appl. No. 15/003,718, 9 pages.
US Notice of Allowance dated Mar. 29, 2016, from related U.S. Appl. No. 15/003,590, 11 pages.
US Office Action dated Jul. 29, 2016 from related U.S. Appl. No. 14/680,877, 8 pages.
US Office Action dated May 13, 2016, from related U.S. Appl. No. 14/676,740, 15 pages.
US Office Action dated May 6, 2016, from related U.S. Appl. No. 14/659,498, 20 pages.
Wahlstrom et al., "Modeling Magnetic Fields Using Gaussian Processes," 2013 IEEE International Conference on Acoustics, Speech, and Signal Processing, pp. 3522-3526 (May 26-31, 2013).
Fallah et al., "Multi-sensor approach in vessel magnetic wake imaging," Wave Motion 51(1): 60-76 (Jan. 2014), retrieved from http://www.sciencedirect.com/science/article/pii/S0165200113 (Aug. 21, 2016).
International Search Report and Written Opinion of the International Searching Authority dated Sep. 13, 2016, from related PCT application PCT/US16/14377, 11 pages.
Soykal et al., "Quantum metrology with a single spin-3/2 defect in silicon carbide," Mesoscale and Nanoscale Physics (May 24, 2016), retrieved from https://arxiv.org/abs/1605.07628 (Sep. 22, 2016), 9 pages.
Teale, "Magnetometry with Ensembles of Nitrogen Vacancy Centers in Bulk Diamond," Master's Thesis, Massachusetts Institute of Technology Department of Electrical Engineering and Computer Science (Sep. 2015), 57 pages.
Widmann et al., "Coherent control of single spins in silicon carbide at room temperature," Nature Materials, 14: 164-168 (Feb. 2015) (available online Dec. 1, 2014).
US Office Action dated Aug. 24, 2016 from related U.S. Appl. No. 14/676,740, 19 pages.
Notice of Allowance dated Aug. 17, 2016, from related U.S. Appl. No. 15/003,718, 8 pages.
US Office Action dated Oct. 14, 2016 from related U.S. Appl. No. 15/003,677, 13 pages.
US Office Action dated Oct. 19, 2016 from related U.S. Appl. No. 15/218,821, 6 pages.
International Preliminary Report on Patentability dated Oct. 20, 2016 from related PCT application PCT/US2015/024723, 7 pages.
US Office Action dated Nov. 2, 2016, from related U.S. Appl. No. 15/003,256, 19 pages.
US Office Action dated Nov. 3, 2016 from related U.S. Appl. No. 15/204,675, 9 pages.

* cited by examiner

DIAMOND NITROGEN VACANCY SENSOR WITH COMMON RF AND MAGNETIC FIELDS GENERATOR

FIELD BACKGROUND

The present invention relates generally to a sensor assembly of a magnetic sensor.

Magnetic sensors based on a nitrogen vacancy (NV) center in diamond are known. Diamond NV (DNV) sensors may provide good sensitivity for magnetic field measurements. Such magnetic sensor systems often include components such an optical excitation source, an RF excitation source, and optical detectors. These components are all formed on different substrates or as separate components mechanically supported together.

SUMMARY

Systems and apparatuses are described that use multiple radio frequency elements for providing a uniform magnetic field over an NV diamond and also providing a magnetic bias for the NV diamond. In one implementation, a magnetic field sensor assembly includes four side radio frequency (RF) elements. Each side RF element includes an RF connection. The magnetic field sensor also includes four side RF feed cables connected to one of the four side RF elements such that each side RF element is connected to one RF feed cable that provides a feed signal to the side RF element. The magnetic field sensor also includes a top RF element and a bottom element along with a top RF element feed cable and a bottom RF feed cable. The top and bottom feed cables provide a RF feed signal to the top and bottom RF elements respectively. The four side RF side elements, the top RF element, and the bottom RF element are arranged in a cube formation. A nitrogen-vacancy (NV) center diamond is located within the cube formation. The side RF elements, top RF element, and bottom RF element generate a microwave signal that is uniform over the NV center diamond, and also generate a magnetic bias field to the NV center diamond.

In other implementations, a magnetic field sensor assembly includes four side radio frequency (RF) elements. Each side RF element includes an RF connection. The magnetic field sensor also includes four side RF feed cables connected to one of the four side RF elements such that each side RF element is connected to one RF feed cable that provides a feed signal to the side RF element. The magnetic field sensor also includes a top RF element and a bottom element along with a top RF element feed cable and a bottom RF feed cable. The top and bottom feed cables provide a RF feed signal to the top and bottom RF elements respectively. The four side RF side elements, the top RF element, and the bottom RF element are arranged in a column formation. A nitrogen-vacancy (NV) center diamond is located within the column formation. The side RF elements, top RF element, and bottom RF element generate a microwave signal that is uniform over the NV center diamond, and also generate a magnetic bias field to the NV center diamond.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several implementations in accordance with the disclosure and are, therefore, not to be considered limiting of its scope, the disclosure will be described with additional specificity and detail through use of the accompanying drawings.

DETAILED DESCRIPTION

Figure 1:
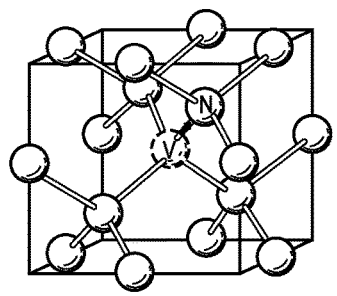
FIG. 1 illustrates one orientation of an NV center in a diamond lattice.

Nitrogen-vacancy (NV) centers are defects in a diamond's crystal structure. Synthetic diamonds can be created that have these NV centers. NV centers generate red light when excited by a light source, such as a green light source, and microwave radiation. When an excited NV center diamond is exposed to an external magnetic field the frequency of the microwave radiation at which the diamond generates red light and the intensity of the light change. By measuring this change and comparing the change to the microwave frequency that the diamond generates red light at when not in the presence of the external magnetic field, the external magnetic field strength can be determined. Accordingly, NV centers can be used as part of a magnetic field sensor.

In various implementations, microwave RF excitation is needed in a DNV sensor. The more uniform the microwave signal is across the NV centers in the diamond the better and more accurate an NV sensor will perform. Uniformity, however, can be difficult to achieve. Also, the larger the bandwidth of the element, the better the NV sensor will perform. Large bandwidth, such as octave bandwidth, however, can be difficult to achieve. Various NV sensors respond to a microwave frequency that is not easily generated by RF antenna elements that are comparable to the small size of the NV sensor. In addition, RF elements should reduce the amount of light within the sensor that is blocked by the RF elements. When a single RF element is used, the RF element is offset from the NV diamond when the RF element maximized the faces and edges of the diamond that light can enter or leave. Moving the RF element away from the NV diamond, however, impacts the uniformity of strength of the RF that is applied to the NV diamond.

The present inventors have realized that a configuration of RF elements can provide both the magnetic bias and the RF field for a DNV magnetic system. The magnetic bias provided by various implementations can be a uniform magnetic field along three polarizations of the axes of the coils used in various implementations. As described in greater detail below, using the various configuration of RF elements in a DNV sensor can allow greater access to the edges and faces of the diamond for light input and egress, while also providing a relatively uniform field in addition to a bias magnetic field. In various implementations, a NV diamond is contained within a housing. The housing can have six sides, each side operating as an RF element to apply a uniform RF field to the NV diamond. In addition, the six RF elements can also provide the magnetic bias for the NV sensor. Further, the six sides can be configured to allow various different configurations for light ingress and egress. The spacing and size of the RF elements allow for all edges and faces of the diamond to be used for light ingress and egress. The more light captured by photo-sensing elements of a DNV sensor results in an increased efficiency of the sensor. In addition, the multiple polarization RF field of various implementations can increase the number of NV centers that are efficiently excited. In addition, the multiple polarization RF field can be used to differentially control the polarizations to achieve higher order functionality from the DNV sensor.

NV Center, its Electronic Structure, and Optical and RF Interaction

The nitrogen vacancy (NV) center in diamond comprises a substitutional nitrogen atom in a lattice site adjacent a carbon vacancy as shown in FIG. 1. The NV center may have four orientations, each corresponding to a different crystallographic orientation of the diamond lattice.

The NV center may exist in a neutral charge state or a negative charge state. Conventionally, the neutral charge state uses the nomenclature $NV^0$, while the negative charge state uses the nomenclature NV, which is adopted in this description.

The NV center has a number of electrons including three unpaired electrons, each one from the vacancy to a respective of the three carbon atoms adjacent to the vacancy, and a pair of electrons between the nitrogen and the vacancy. The NV center, which is in the negatively charged state, also includes an extra electron.

Figure 2:
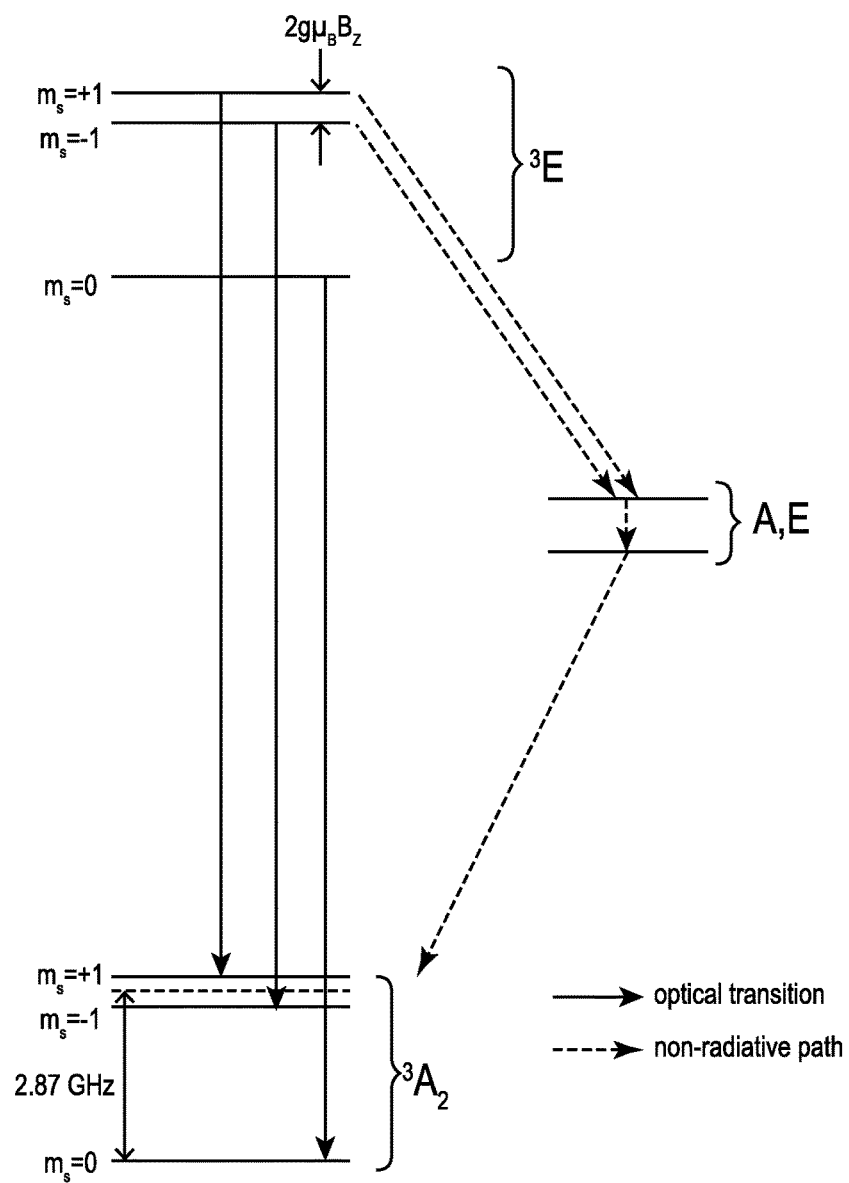
FIG. 2 is an energy level diagram illustrates energy levels of spin states for the NV center.

The NV center has rotational symmetry, and as shown in FIG. 2, has a ground state, which is a spin triplet with $^3A_2$ symmetry with one spin state $m_s=0$, and two further spin states $m_s=+1$, and $m_s=-1$. In the absence of an external magnetic field, the $m_s=\pm 1$ energy levels are offset from the $m_s=0$ due to spin-spin interactions, and the $m_s=\pm 1$ energy levels are degenerate, i.e., they have the same energy. The $m_s=0$ spin state energy level is split from the $m_s=\pm 1$ energy levels by an energy of 2.87 GHz for a zero external magnetic field.

Introducing an external magnetic field with a component along the NV axis lifts the degeneracy of the $m_s=\pm 1$ energy levels, splitting the energy levels $m_s=\pm 1$ by an amount 2 $g\mu_B Bz$, where g is the g-factor, $\mu_B$ is the Bohr magneton, and Bz is the component of the external magnetic field along the NV axis. This relationship is correct for a first order and inclusion of higher order corrections is a straight forward matter and will not affect the computational and logic steps in the systems and methods described below.

The NV center electronic structure further includes an excited triplet state $^3E$ with corresponding $m_s=0$ and $m_s=\pm 1$ spin states. The optical transitions between the ground state $^3A_2$ and the excited triplet $^3E$ are predominantly spin conserving, meaning that the optical transitions are between initial and final states which have the same spin. For a direct transition between the excited triplet $^3E$ and the ground state $^3A_2$, a photon of red light is emitted with a photon energy corresponding to the energy difference between the energy levels of the transitions.

There is, however, an alternate non-radiative decay route from the triplet $^3E$ to the ground state $^3A_2$ via intermediate electron states, which are thought to be intermediate singlet states A, E with intermediate energy levels. Significantly, the transition rate from the $m_s=\pm 1$ spin states of the excited triplet $^3E$ to the intermediate energy levels is significantly greater than the transition rate from the $m_s=0$ spin state of the excited triplet $^3E$ to the intermediate energy levels. The transition from the singlet states A, E to the ground state triplet $^3A_2$ predominantly decays to the $m_s=0$ spin state over the $m_s=\pm 1$ spin states. These features of the decay from the excited triplet $^3E$ state via the intermediate singlet states A, E to the ground state triplet $^3A_2$ allows that if optical excitation is provided to the system, the optical excitation will eventually pump the NV center into the $m_s=0$ spin state of the ground state $^3A_2$. In this way, the population of the $m_s=0$ spin state of the ground state $^3A_2$ may be "reset" to a maximum polarization determined by the decay rates from the triplet $^3E$ to the intermediate singlet states.

Another feature of the decay is that the fluorescence intensity due to optically stimulating the excited triplet $^3E$ state is less for the $m_s=\pm 1$ states than for the $m_s=0$ spin state.

This is so because the decay via the intermediate states does not result in a photon emitted in the fluorescence band, and because of the greater probability that the $m_s=\pm1$ states of the excited triplet $^3E$ state will decay via the non-radiative decay path. The lower fluorescence intensity for the $m_s=\pm1$ states than for the $m_s=0$ spin state allows the fluorescence intensity to be used to determine the spin state. As the population of the $m_s=\pm1$ states increases relative to the $m_s=0$ spin, the overall fluorescence intensity will be reduced.

NV Center, or Magneto-Optical Defect Center, Magnetic Sensor System

Figure 3:
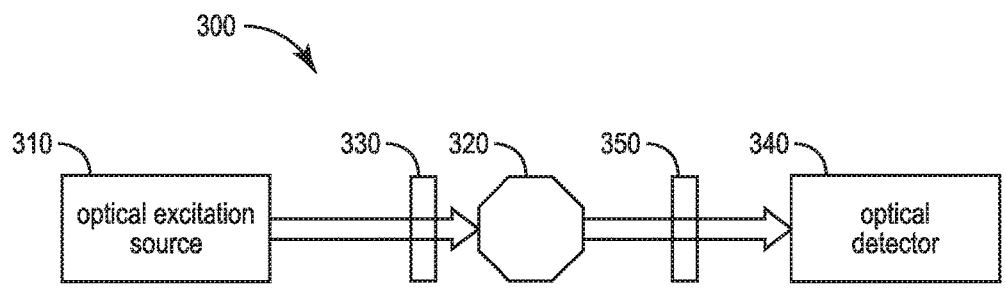
FIG. 3 is a schematic illustrating an NV center magnetic sensor system.

FIG. 3 is a schematic illustrating a NV center magnetic sensor system 300 which uses fluorescence intensity to distinguish the $m_s=\pm1$ states, and to measure the magnetic field based on the energy difference between the $m_s=\pm1$ state and the $m_s=-1$ state. The system 300 includes an optical excitation source 310, which directs optical excitation to an NV diamond material 320 with NV centers. The system 300 further includes an RF excitation source 330 which provides RF radiation to the NV diamond material 320. Light from the NV diamond may be directed through an optical filter 350 to an optical detector 340.

The RF excitation source 330 may be a microwave coil, for example. The RF excitation source 330 when emitting RF radiation with a photon energy resonant with the transition energy between ground $m_s=0$ spin state and the $m_s=+1$ spin state excites a transition between those spin states. For such a resonance, the spin state cycles between ground $m_s=0$ spin state and the $m_s=+1$ spin state, reducing the population in the $m_s=0$ spin state and reducing the overall fluorescence at resonance. Similarly resonance occurs between the $m_s=0$ spin state and the $m_s=-1$ spin state of the ground state when the photon energy of the RF radiation emitted by the RF excitation source is the difference in energies of the $m_s=0$ spin state and the $m_s=-1$ spin state. At resonance between the $m_s=0$ spin state and the $m_s=-1$ spin state, or between the $m_s=0$ spin state and the $m_s=+1$ spin state, there is a decrease in the fluorescence intensity.

The optical excitation source 310 may be a laser or a light emitting diode, for example, which emits light in the green, for example. The optical excitation source 310 induces fluorescence in the red, which corresponds to an electronic transition from the excited state to the ground state. Light from the NV diamond material 320 is directed through the optical filter 350 to filter out light in the excitation band (in the green for example), and to pass light in the red fluorescence band, which in turn is detected by the detector 340. The optical excitation light source 310, in addition to exciting fluorescence in the diamond material 320, also serves to reset the population of the $m_s=0$ spin state of the ground state $^3A_2$ to a maximum polarization, or other desired polarization.

Figure 4:
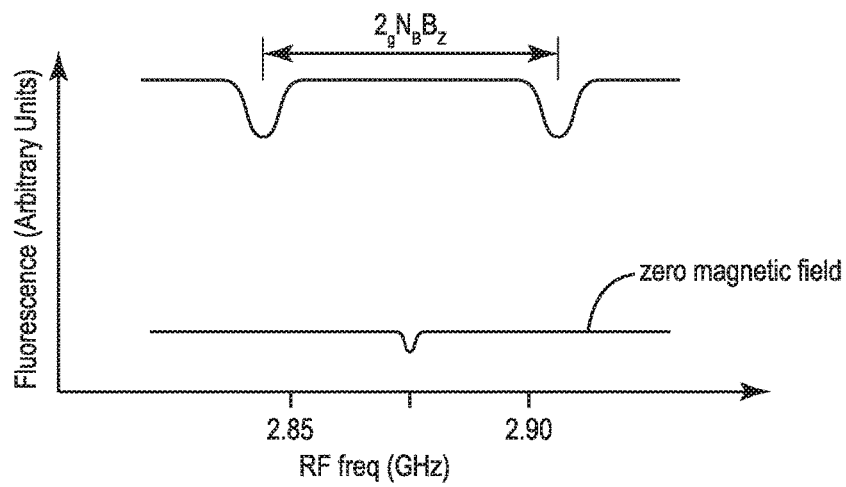
FIG. 4 is a graph illustrating the fluorescence as a function of applied RF frequency of an NV center along a given direction for a zero magnetic field and a non-zero magnetic field.

For continuous wave excitation, the optical excitation source 310 continuously pumps the NV centers, and the RF excitation source 330 sweeps across a frequency range which includes the zero splitting (when the $m_s=\pm1$ spin states have the same energy) photon energy of 2.87 GHz. The fluorescence for an RF sweep corresponding to a diamond material 320 with NV centers aligned along a single direction is shown in FIG. 4 for different magnetic field components Bz along the NV axis, where the energy splitting between the $m_s=-1$ spin state and the $m_s=+1$ spin state increases with Bz. Thus, the component Bz may be determined. Optical excitation schemes other than continuous wave excitation are contemplated, such as excitation schemes involving pulsed optical excitation, and pulsed RF excitation. Examples, of pulsed excitation schemes include Ramsey pulse sequence, and spin echo pulse sequence.

Figure 5:
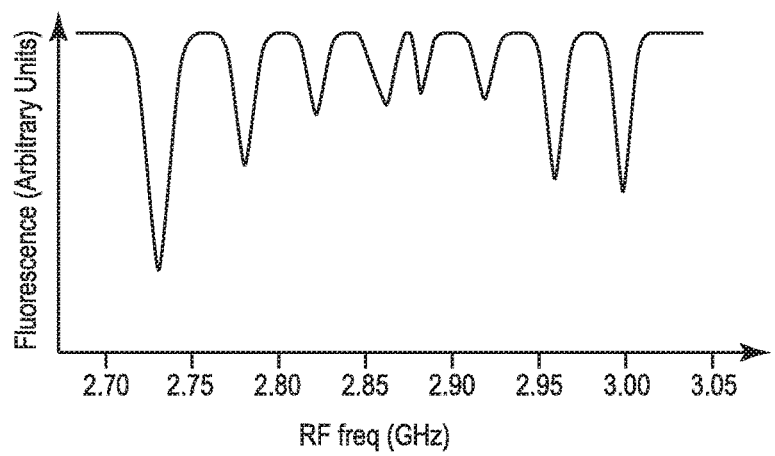
FIG. 5 is a graph illustrating the fluorescence as a function of applied RF frequency for four different NV center orientations for a non-zero magnetic field.

In general, the diamond material 320 will have NV centers aligned along directions of four different orientation classes. FIG. 5 illustrates fluorescence as a function of RF frequency for the case where the diamond material 320 has NV centers aligned along directions of four different orientation classes. In this case, the component Bz along each of the different orientations may be determined. These results along with the known orientation of crystallographic planes of a diamond lattice allows not only the magnitude of the external magnetic field to be determined, but also the direction of the magnetic field.

While FIG. 3 illustrates an NV center magnetic sensor system 300 with NV diamond material 320 with a plurality of NV centers, in general the magnetic sensor system may instead employ a different magneto-optical defect center material, with a plurality of magneto-optical defect centers. The electronic spin state energies of the magneto-optical defect centers shift with magnetic field, and the optical response, such as fluorescence, for the different spin states is not the same for all of the different spin states. In this way, the magnetic field may be determined based on optical excitation, and possibly RF excitation, in a corresponding way to that described above with NV diamond material.

Figure 6:
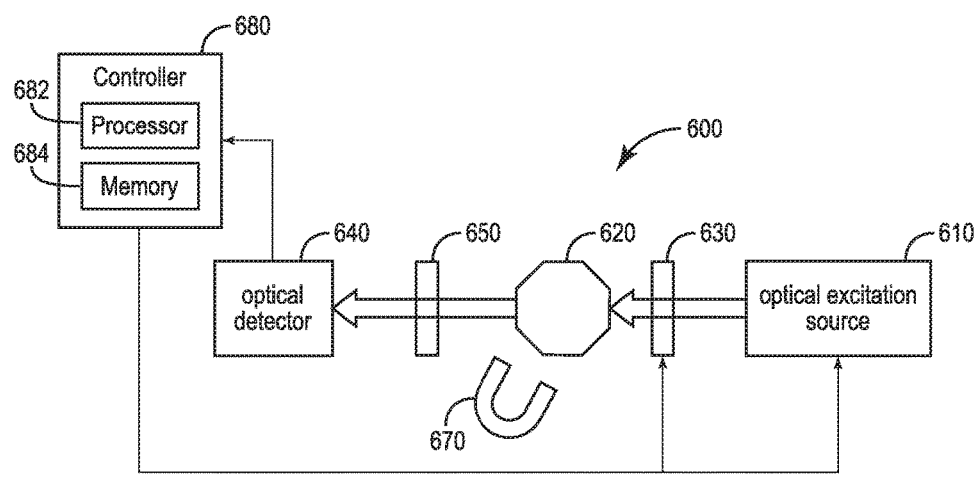
FIG. 6 is a schematic illustrating an NV center magnetic sensor system in accordance with some illustrative implementations.

FIG. 6 is a schematic of an NV center magnetic sensor 600, according to an embodiment of the invention. The sensor 600 includes an optical excitation source 610, which directs optical excitation to an NV diamond material 620 with NV centers, or another magneto-optical defect center material with magneto-optical defect centers. An RF excitation source 630 provides RF radiation to the NV diamond material 620. The NV center magnetic sensor 600 may include a bias magnet 670 applying a bias magnetic field to the NV diamond material 620. Light from the NV diamond material 620 may be directed through an optical filter 650 and an electromagnetic interference (EMI) filter 660, which suppresses conducted interference, to an optical detector 640. The sensor 600 further includes a controller 680 arranged to receive a light detection signal from the optical detector 640 and to control the optical excitation source 610 and the RF excitation source 630.

The RF excitation source 630 may be a microwave coil, for example. The RF excitation source 630 is controlled to emit RF radiation with a photon energy resonant with the transition energy between the ground $m_s=0$ spin state and the $m_s=\pm1$ spin states as discussed above with respect to FIG. 3.

The optical excitation source 610 may be a laser or a light emitting diode, for example, which emits light in the green, for example. The optical excitation source 610 induces fluorescence in the red, which corresponds to an electronic transition from the excited state to the ground state. Light from the NV diamond material 620 is directed through the optical filter 650 to filter out light in the excitation band (in the green for example), and to pass light in the red fluorescence band, which in turn is detected by the optical detector 640. The EMI filter 660 is arranged between the optical filter 650 and the optical detector 640 and suppresses conducted interference. The optical excitation light source 610, in addition to exciting fluorescence in the NV diamond material 620, also serves to reset the population of the $m_s=0$ spin state of the ground state $^3A_2$ to a maximum polarization, or other desired polarization.

The controller 680 is arranged to receive a light detection signal from the optical detector 640 and to control the optical excitation source 610 and the RF excitation source 630. The controller may include a processor 682 and a memory 684, in order to control the operation of the optical excitation source 610 and the RF excitation source 630. The memory 684, which may include a nontransitory computer readable medium, may store instructions to allow the operation of the optical excitation source 610 and the RF excitation source 630 to be controlled.

According to one embodiment of operation, the controller 680 controls the operation such that the optical excitation source 610 continuously pumps the NV centers of the NV diamond material 620. The RF excitation source 630 is controlled to continuously sweep across a frequency range which includes the zero splitting (when the $m_s=\pm 1$ spin states have the same energy) photon energy of 2.87 GHz. When the photon energy of the RF radiation emitted by the RF excitation source 630 is the difference in energies of the $m_s=0$ spin state and the $m_s=-1$ or $m_s=+1$ spin state, the overall fluorescence intensity is reduced at resonance, as discussed above with respect to FIG. 3. In this case, there is a decrease in the fluorescence intensity when the RF energy resonates with an energy difference of the $m_s=0$ spin state and the $m_s=-1$ or $m_s=+1$ spin states. In this way the component of the magnetic field Bz along the NV axis may be determined by the difference in energies between the $m_s=-1$ and the $m_s=+1$ spin states.

As noted above, the diamond material 620 will have NV centers aligned along directions of four different orientation classes, and the component Bz along each of the different orientations may be determined based on the difference in energy between the $m_s=-1$ and the $m_s=+1$ spin states for the respective orientation classes. In certain cases, however, it may be difficult to determine which energy splitting corresponds to which orientation class, due to overlap of the energies, etc. The bias magnet 670 provides a magnetic field, which is preferably uniform on the NV diamond material 620, to separate the energies for the different orientation classes, so that they may be more easily identified.

Figure 7:
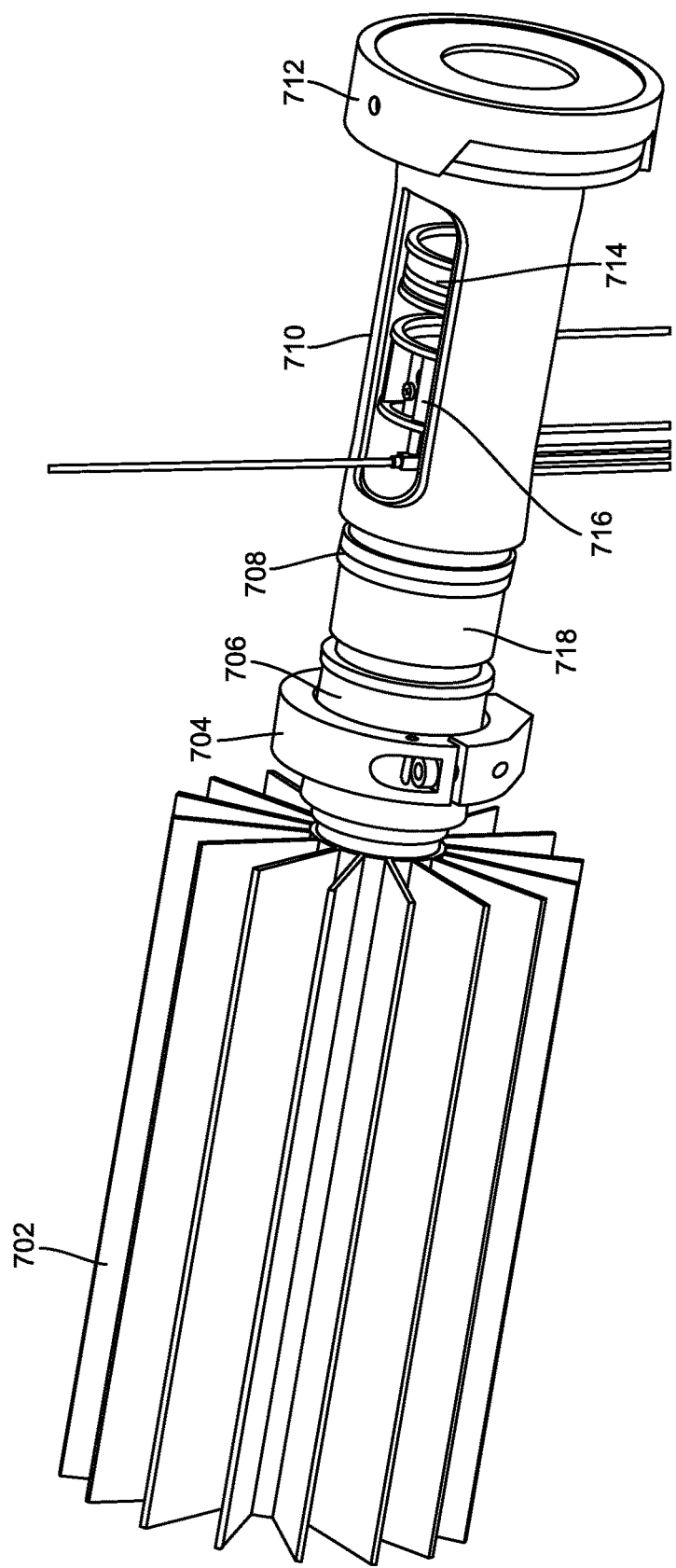
FIG. 7 is a schematic illustrating a portion of a DNV sensor with a coil assembly in accordance with some illustrative implementations.

FIG. 7 is a schematic illustrating a portion of a DNV sensor with a coil assembly in accordance with some illustrative implementations. The magnetic sensor shown in FIG. 6 used a single RF excitation source 630 and a bias magnet 670. The DNV sensor illustrated in FIG. 7 uses six separate RF elements that also provide the bias field that is provided the bias magnet 670 in FIG. 6. Accordingly, in various implementations, the DNV sensor shown in FIG. 7 does not require a separate bias magnetic. FIGS. 7-13 illustrate various components of the DNV sensor.

In FIG. 7, the portion of the illustrated DNV sensor includes a heatsink 702 that can connect to the rest of the DNV sensor via a mounting clamp. Not shown is a light element, such as a laser or LED that is located within or near the heatsink 702. Light from the light element travels through a lens tube 706 through a focusing lens tube 718 and through a coil assembly 716 that includes the NV diamond. Light passes into the coil assembly 716 through the NV diamond and exits the coil assembly. Light that exits the coil assembly passes through a red filter to a photo sensor assembly 714. The coil assembly 716, red filter, and photo sensor can all be housed in a lens tube 710 that can be coupled to lens tube 718 via a lens tube coupler 708. A lens tube rotation mount 712 allows a rotation adjustment element to be attached that allows the coil assembly to be rotated in relation to the light element.

Figure 8:
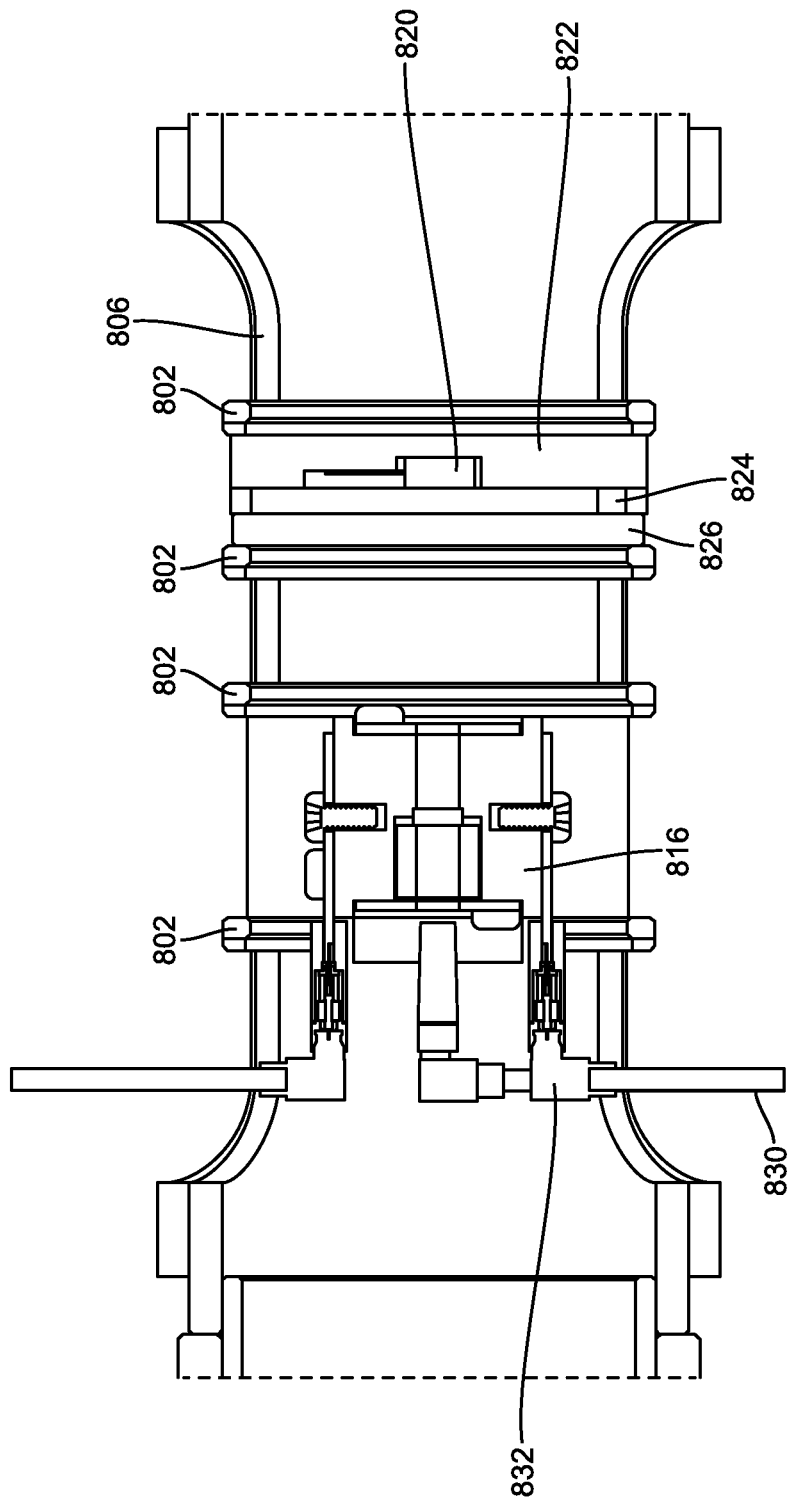
FIG. 8 is a schematic illustrating a cross section of a portion of a DNV sensor with a coil assembly in accordance with some illustrative implementations.
Figure 9B:
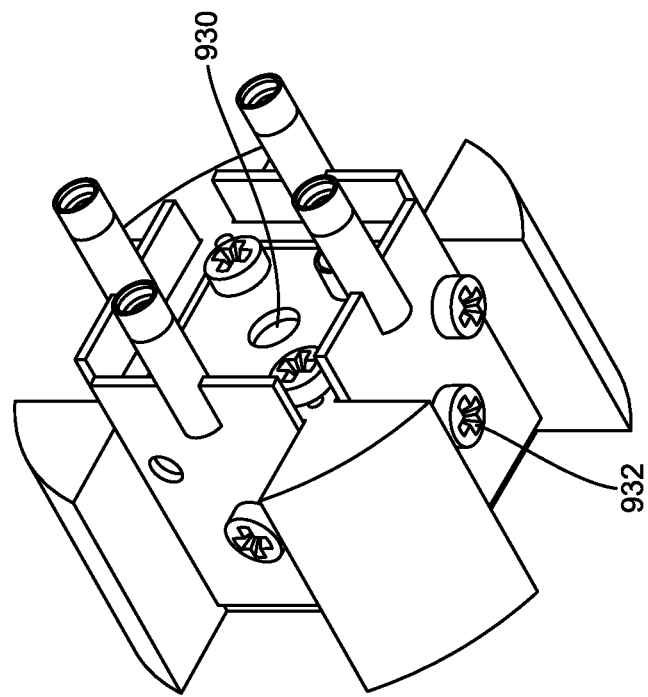
FIGS. 9A and 9B are schematics illustrating a coil assembly in accordance with some illustrative implementations.
Figure 9A:
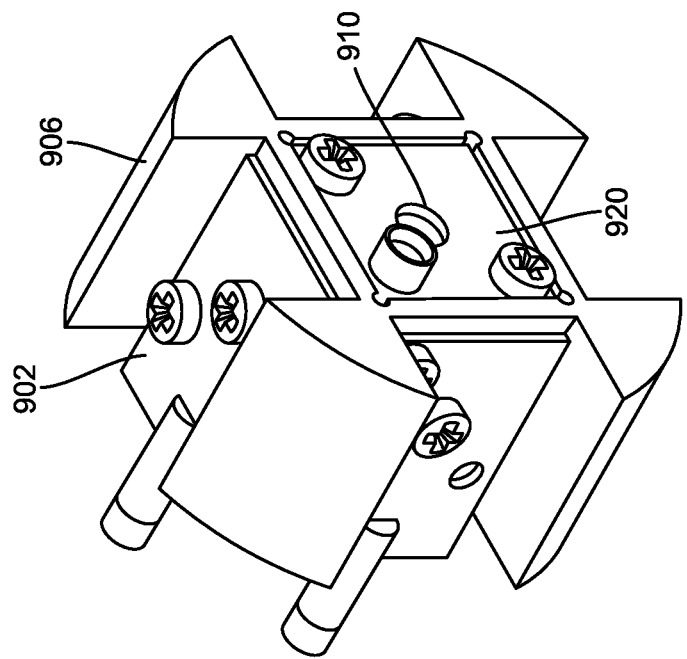

FIG. 8 is a schematic illustrating a cross section of a portion of a DNV sensor with a coil assembly in accordance with some illustrative implementations. The portion of the DNV sensor that is illustrated contains the coil assembly 816 and the photo sensor 820. The coil assembly 816 includes six RF elements. Each RF element has an RF mount that can be used to connect an RF cable 830. Thus, each RF element can have its own RF feed. In various implementations, the each RF element is fed a unique RF signal. In other implementations, sub-combinations of the RF elements receive the same RF feed signal. For example, groups of two or three RF elements can receive the same RF feed signal. Various connectors can be used to connect an RF cable 830 to the RF elements, such as a right angle connector 832. The coil assembly 816, red filter 826, EMI glass 824, and photo sensor mounting plate can be held in place using retaining rings 802. A photo sensor 820 can be secured to the photo sensor mounting plate 822, which can be used to locate the photo sensor 820 in the path of light that exits the coil assembly 816.

Figure 10:
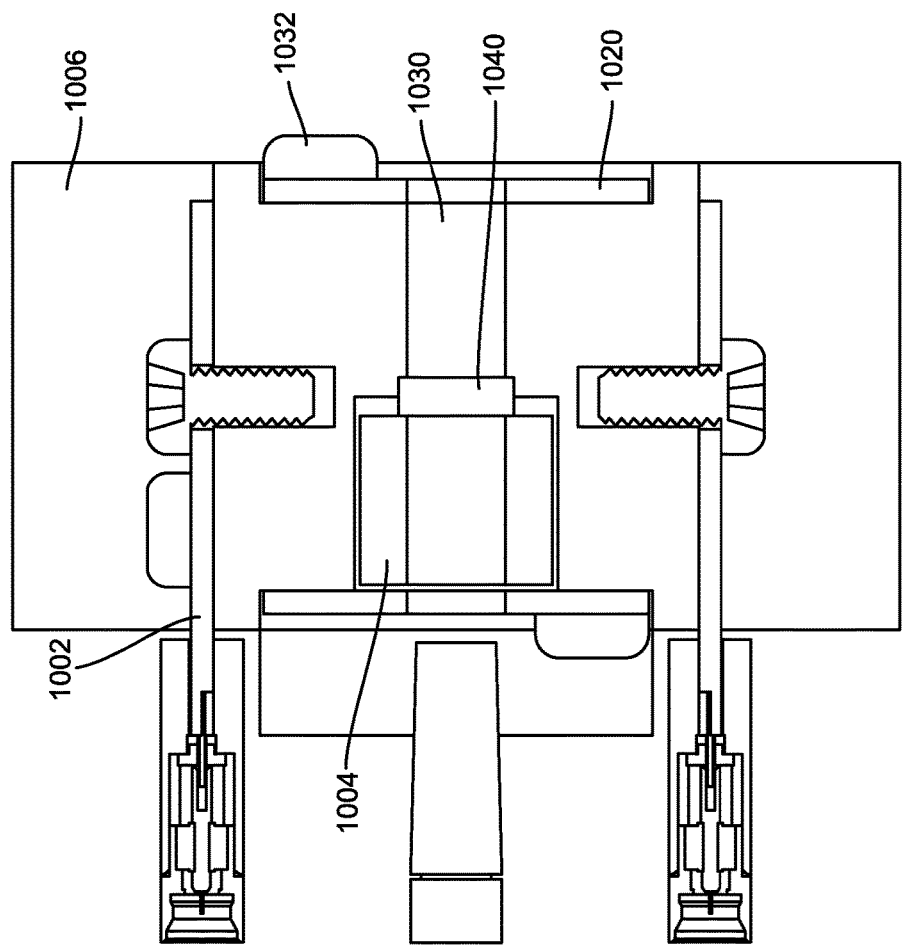
FIG. 10 is a cross section illustrating a coil assembly in accordance with some illustrative implementations.

FIG. 10 is a cross section illustrating a coil assembly in accordance with some illustrative implementations. In this illustration, the light path 1030 is shown. The light path allows for light from the lighting element to pass through the coil assembly and through the NV diamond 1040. Light exits the NV diamond and proceeds out of the coil assembly through the light path 1030.

The coil assembly includes four RF elements 1002 and two top and bottom elements 1020. The NV diamond 1040 is held in place via a diamond plug 1004 that holds the diamond in the mounting block 1006. The RF elements can be held together using various means such as element mounting screws 1032. The six total RF elements can be seen in FIGS. 9A and 9B that illustrate a coil assembly in accordance with some illustrative implementations. Four side RF elements 902 are shown along with two top and bottom RF elements 920. Each RF element is attached to a center mounting block 904. Attachment mechanisms such as screws 932 can be used to attach the RF elements to the mounting block. In the illustrated implementation, a light injection hole 930 is the bottom RF element and the light exit hole 910 is in the top RF element. Accordingly, in this implementation light passes through the coil assembly and the diamond in a straight path. In one implementation, the light enters a face of the NV diamond and exits through another face of the NV diamond. As described below, in other implementation the light path through the coil assembly is not straight and may take on multiple paths of egress.

Figure 11:
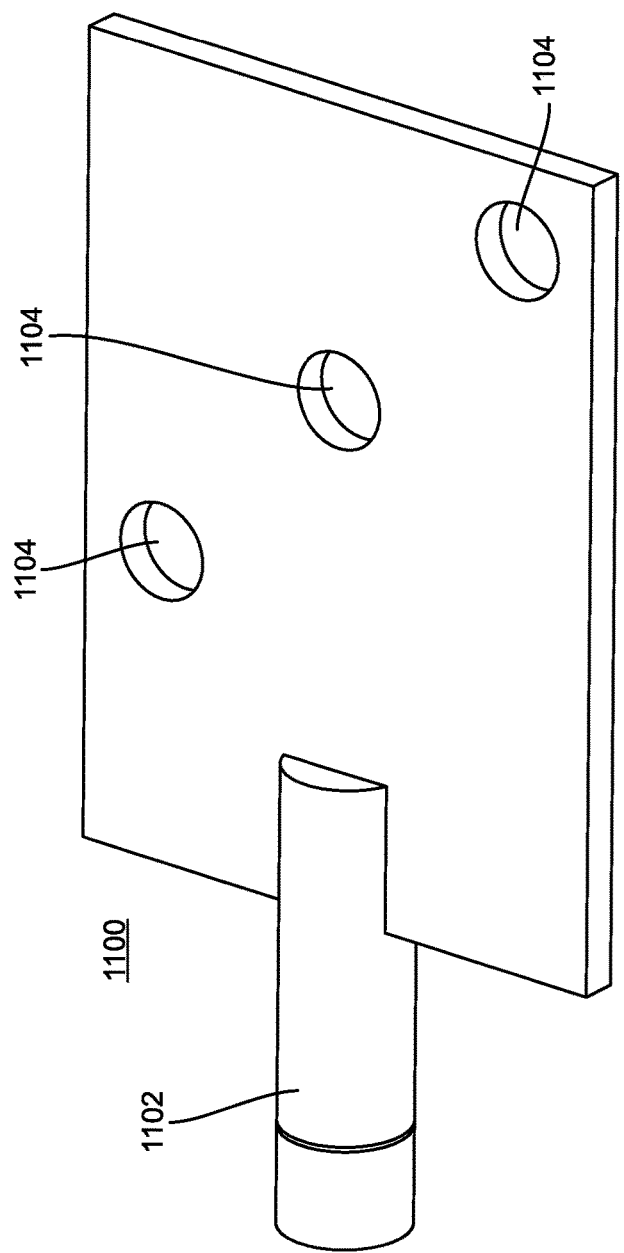
FIG. 11 is a schematic illustrating a side element of a coil assembly in accordance with some illustrative implementations.

FIG. 11 is a schematic illustrating a side element 1100 of a coil assembly in accordance with some illustrative implementations. The side element 1100 can include a middle mounting hole and one other mounting hole. In this implementation, there would be side elements that had different mounting hole configurations. As shown in FIG. 11, the side element 1100 has three mounting holes, but not all mounting holes are required to be used. In one implementation, the middle mounting hole and one of the remaining two mounting holes are used, but all three mounting holes are not used. Each side element 1100 includes an RF connector 1102 that is used to provide the RF feed signal to the side element.

Figure 12:
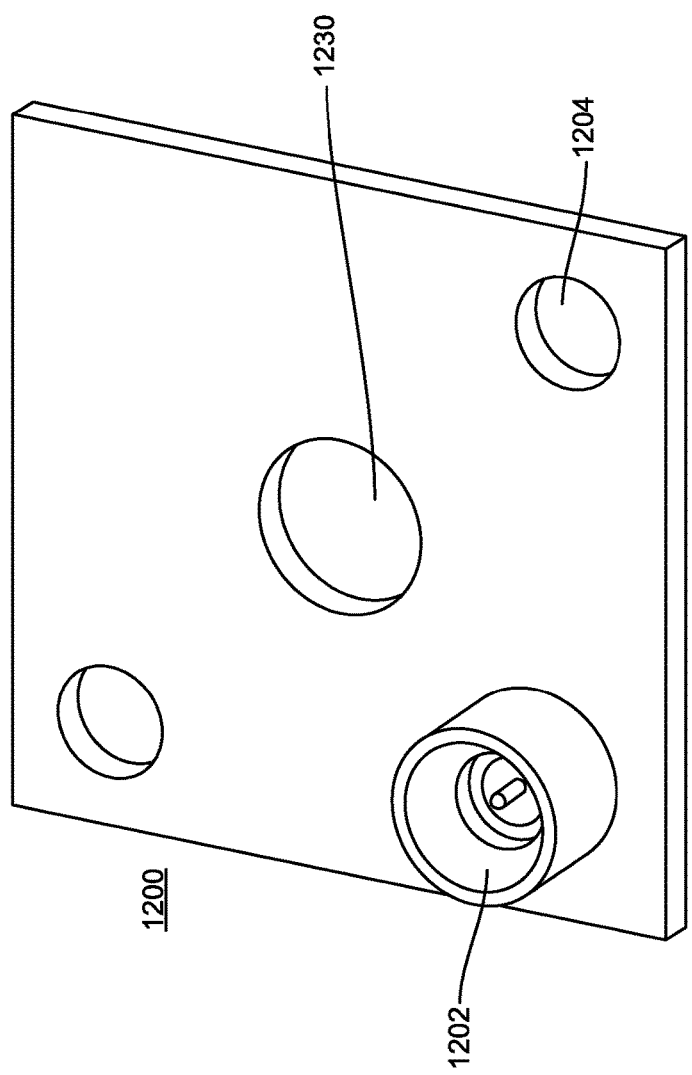
FIG. 12 is a schematic illustrating a top or bottom element of a coil assembly in accordance with some illustrative implementations.

FIG. 12 is a schematic illustrating a top or bottom element 1200 of a coil assembly in accordance with some illustrative implementations. Similar to the side element 1100, the top or bottom element 1200 includes an RF connector 1202 for receiving an RF feed signal. The top or bottom element 1200, however, has only two mounting holes 1204. The three hole is a light path portion 1230 that allows for light to enter or exit the coil assembly.

Figure 13:
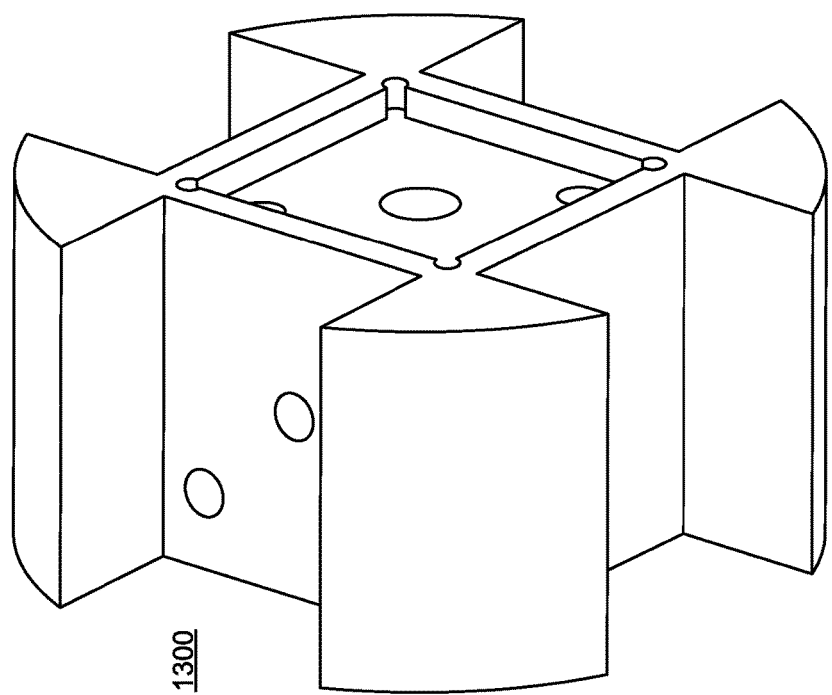
FIG. 13 is a schematic illustrating a center mounting block of a coil assembly in accordance with some illustrative implementations.

FIG. 13 is a schematic illustrating a center mounting block 1300 of a coil assembly in accordance with some illustrative implementations. The NV diamond is located within the mounting block 1300. In one implementation, a diamond plug can be used to hold the NV diamond. The mounting block 1300 can include a diamond mounting location that provides alignment of the NV diamond. For example, the mounting block 1300 can include a recess that fits the NV diamond. Once positioned, the diamond plug can be inserted into the mounting block 1300 to hold the diamond in place.

Figure 14:
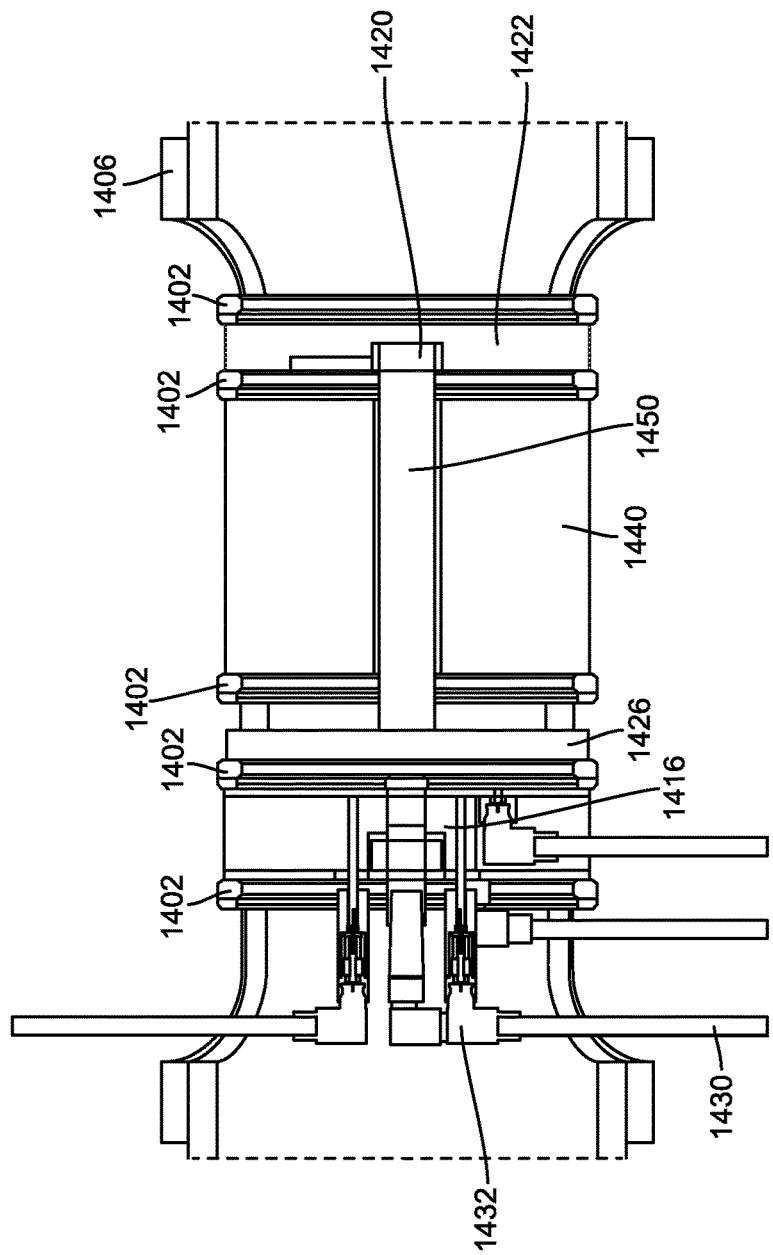
FIG. 14 is a cross section illustrating of a portion of a DNV sensor with a coil assembly in accordance with some illustrative implementations.

FIGS. 14-17 illustrate another implementation. FIG. 14 is a cross section illustrating of a portion of a DNV sensor with a coil assembly in accordance with some illustrative implementations. A coil assembly 1416 holds an NV diamond within an NV diamond sensor. The coil assembly 1416 can include six RF elements, four side elements and two top and bottom elements (shown in FIGS. 15-17). RF cables 1430 can connect to the RF elements via RF connections 1432. The RF cables 1430 are used to provide an RF signal to one or more of the RF elements. The RF signal can be different for each RF element or subsets of the RF elements can receive different RF signals. These RF feed signals are used by the RF elements to provide a uniform microwave RF signal to the NV diamond. In addition, the arrangement of the RF elements allows the RF elements to also provide the magnetic bias field to the NV diamond. In the illustrated implementation, light enters and exits through the top and bottom elements. Light that exits the NV diamond can pass through a red filter 1426 and through a light pipe 1450 that is located within an attenuator 1440. In various implementations, at least a portion of the light pipe 1450 is located within the attenuator 1440. Such a configuration allows the photo-sensing array 1420 to be positioned closer to the NV diamond and remain unaffected by the EMI of the sensor. Further description of the benefits of housing a portion of the light pipe within an attenuator is described in U.S. patent application Ser. No. 15/003,281, entitled "Magnetometer with Light Pipe," filed on the same day as this application, the contents of which are hereby incorporated by reference. Retaining rings 1402 can be used to hold the various elements together and in position.

Figure 15:
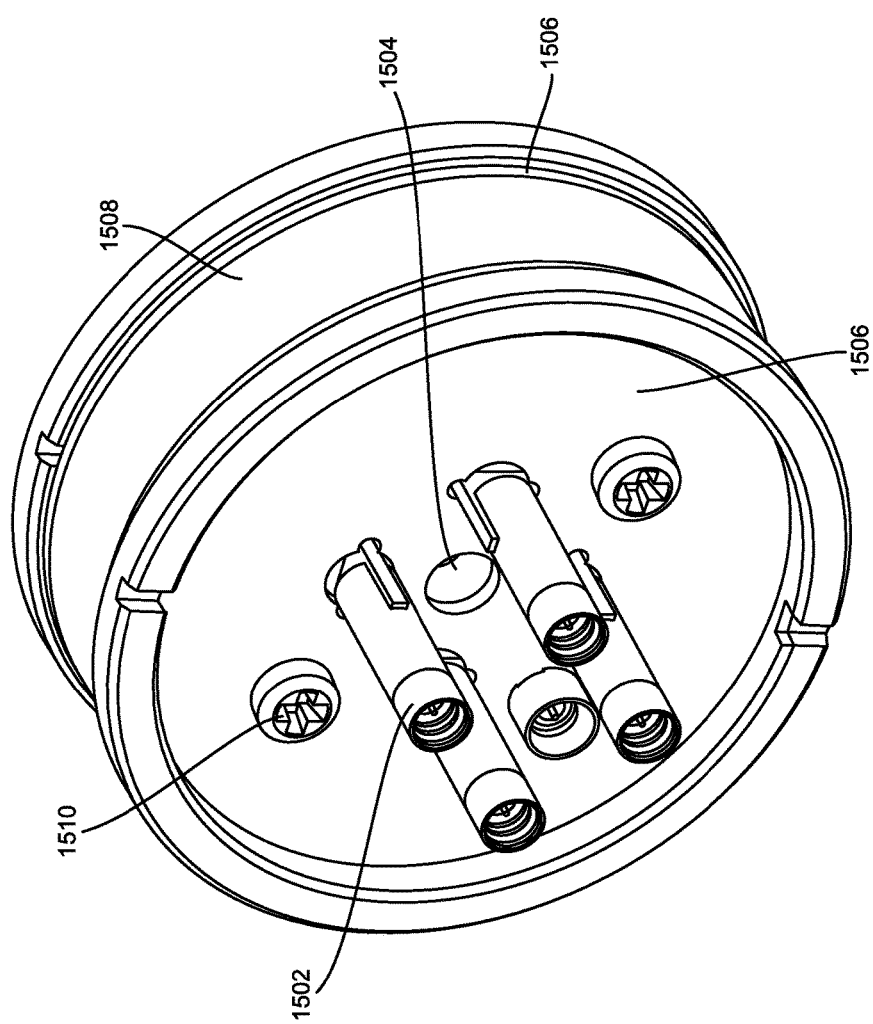
FIG. 15 is a schematic illustrating a coil assembly in accordance with some illustrative implementations.
Figure 16:
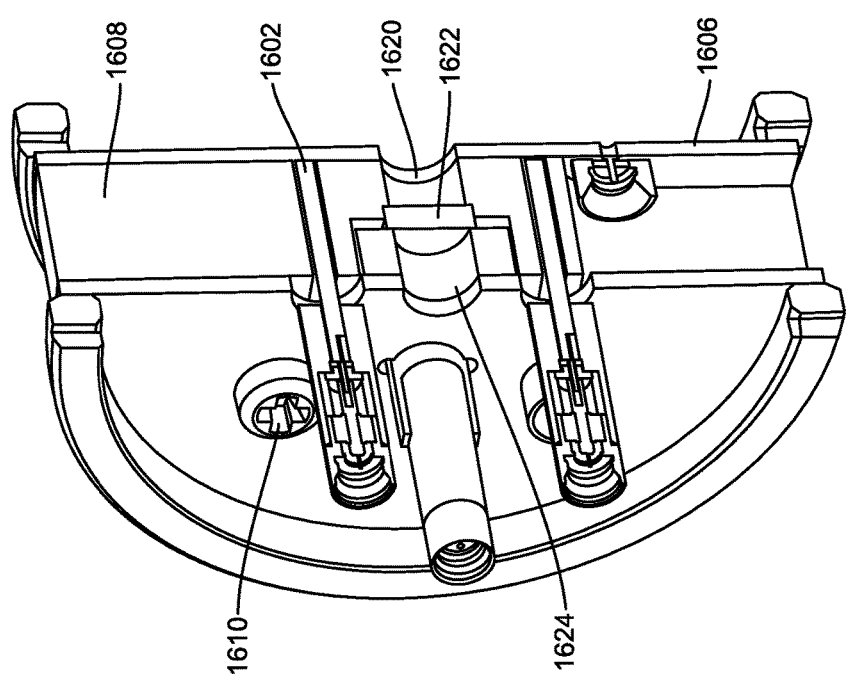
FIG. 16 is a cross section of a coil assembly in accordance with some illustrative implementations.
Figure 17:
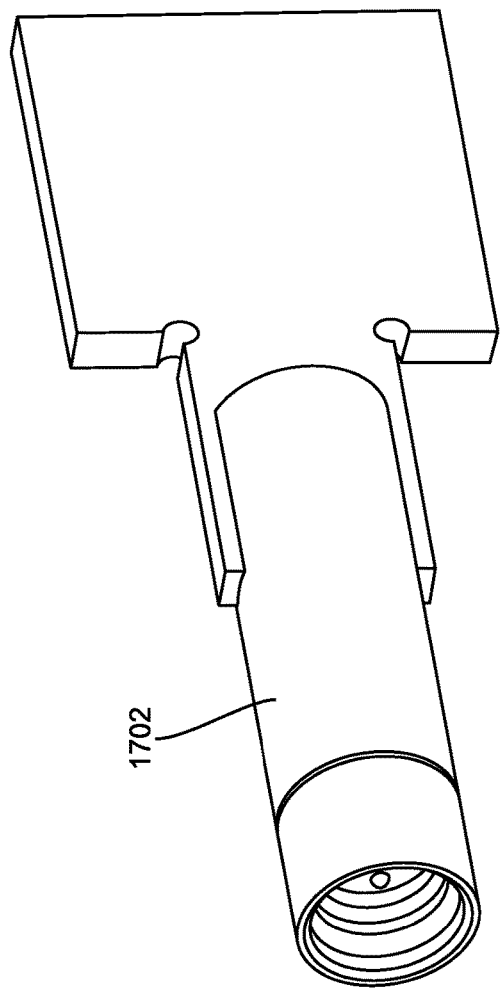
FIG. 17 is a schematic illustrating a side element of a coil assembly in accordance with some illustrative implementations.

FIG. 15 is a schematic illustrating a coil assembly in accordance with some illustrative implementations. FIG. 16 is a schematic illustrating a cross section of a coil assembly in accordance with some illustrative implementations. The coil assembly includes two bottom or top RF elements 1506 and 1606. In the illustrated implementation, the top or bottom RF elements are circular and are larger compared to the side elements 1502 and 1602. In between the top or bottom elements are the four side elements 1502 and 1602. FIG. 17 is a schematic illustrating a side element of a coil assembly in accordance with some illustrative implementations. The side element has an RF connector 1702 used to provide a feed RF signal to the RF element. The side RF elements do not include any mounting holes as the side RF elements can be held into position by the top and bottom RF elements. In various implementations, each of the RF elements can include multiple stacked spiral antenna coils. These stacked coils can occupy a small footprint and can provide the needed microwave RF field in such that the RF field is uniform over the NV diamond. Additional details regarding RF elements and RF circuit boards that contain RF elements are described in U.S. patent application Ser. No. 15/003,309, entitled "DIAMOND NITROGEN VACANCY SENSOR WITH DUAL RF SOURCES," filed on the same day as this application, the contents of which are hereby incorporated by reference. In various implementations, each RF side element and top and bottom RF elements can include an RF element or an RF circuit board.

The NV diamond 1622 is located within the six RF elements. The RF elements can be held together by mounting screws 1510 and 1610. A light injection portion 1504 of the top RF element allows light to enter the coil assembly and enter the NV diamond. The bottom portion includes a corresponding light egress portion 1620. The NV diamond can fit within a mounting block 1608 and be held in position via a diamond plug 1624.

FIGS. 18-24 illustrate another implementation. In the illustrated implementation, light enters the NV diamond through an edge of the NV diamond and exits through multiple faces of the NV diamond. How light enters and exits the NV diamond is based upon the orientation of the NV diamond relative to the light source. Thus, in various implementations the NV diamond can be repositioned to allow light to enter and exit from edges, faces, and/or both edges and faces.

Figure 18:
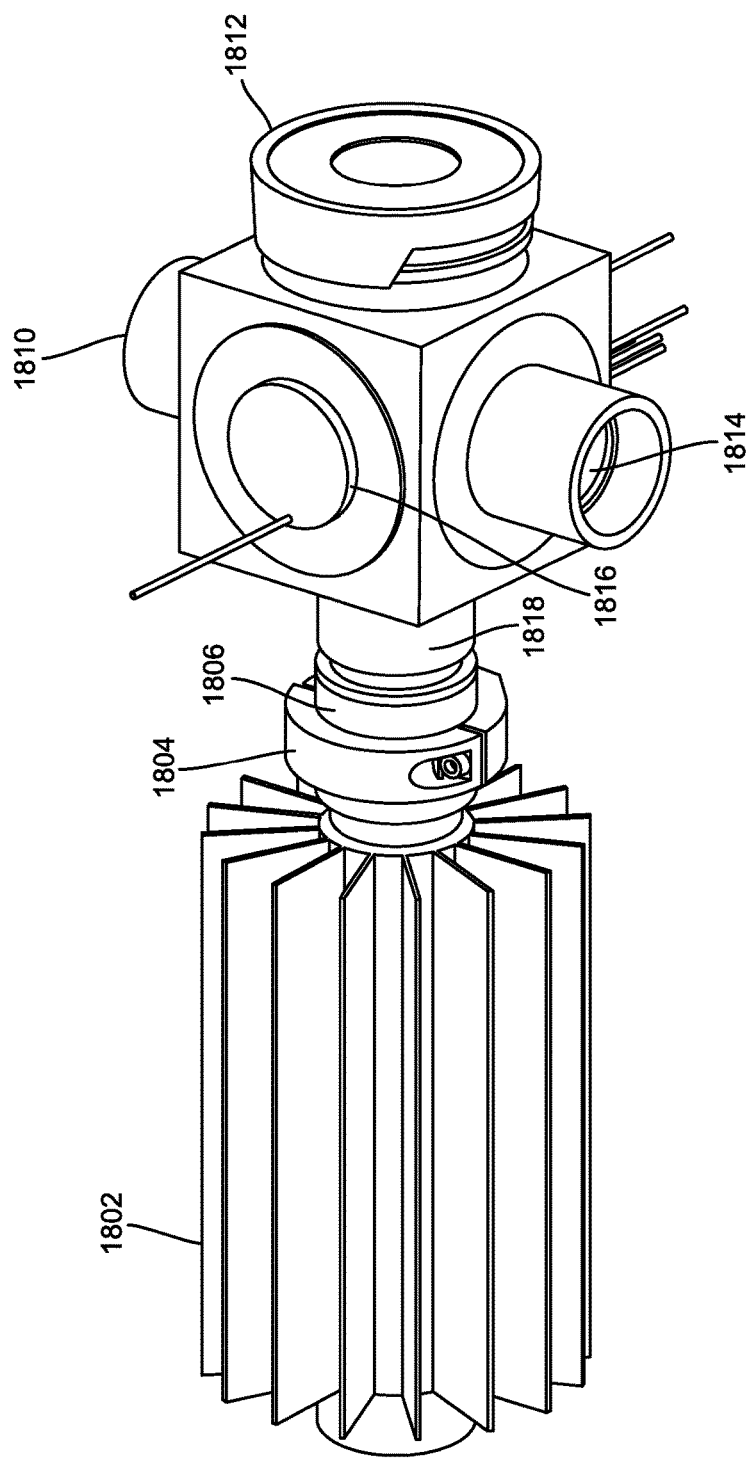
FIG. 18 is a schematic illustrating a portion of a DNV sensor with a coil assembly in accordance with some illustrative implementations.
Figure 19:
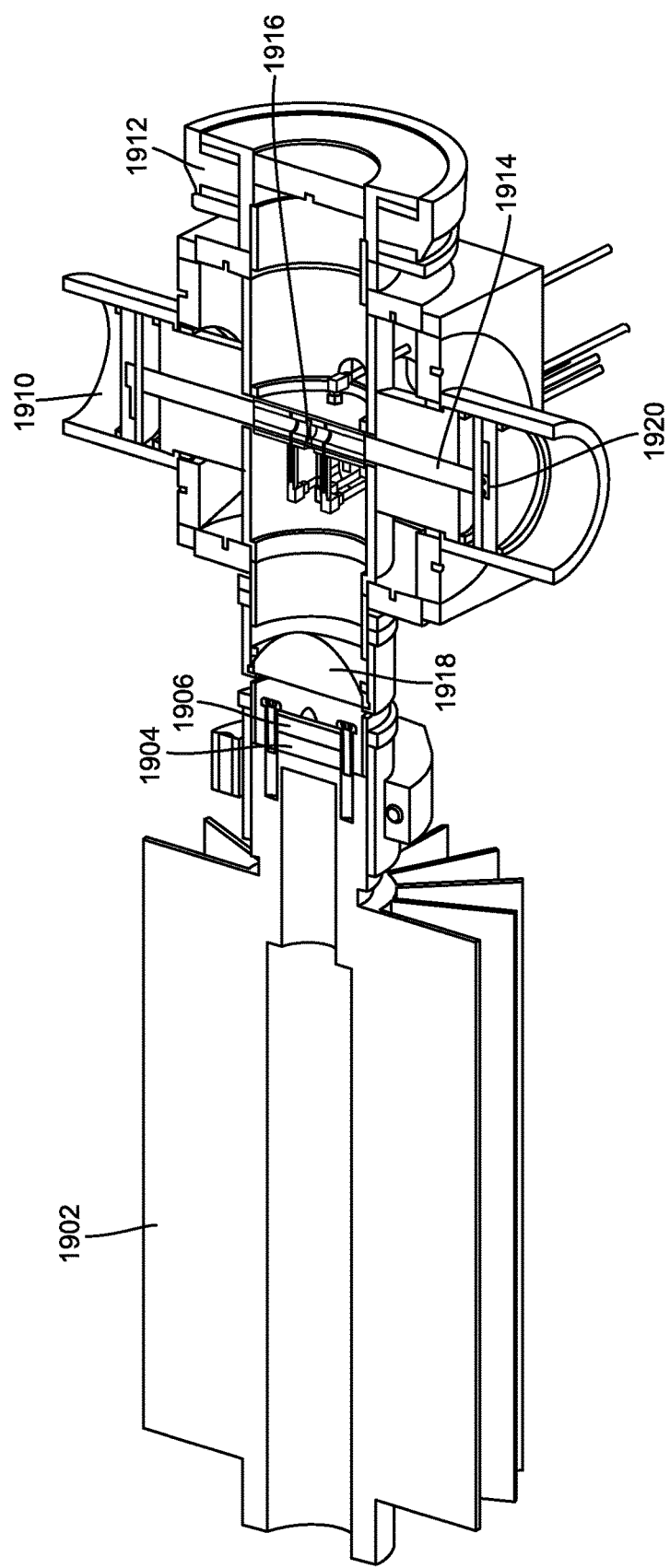
FIG. 19 is a schematic illustrating a cross section of a portion of a DNV sensor with a coil assembly in accordance with some illustrative implementations.

FIG. 18 is a schematic illustrating a portion of a DNV sensor with a coil assembly in accordance with some illustrative implementations. Similar to other implementations, the DNV sensor includes a light source heatsink 1802 and 1902, a mounting clamp 1804 for the heatsink 1802, a lens tube 1806, a focusing lens tube 1818, a coil assembly 1816 located, and red filters and photo sensor assemblies 1814, and a lens tube rotation mount 1812 and 1912. FIG. 19 is a schematic illustrating a cross section of a portion of a DNV sensor with a coil assembly in accordance with some illustrative implementations. In this implementation, the light source is an LED 1906. In other implementations, other light sources, such as a laser, can be used. A thermal electric cooler 1904 can be used to provide cooling for the LED 1906. Light from the LED 1906 can be focused using lens 1918. The focused light enters the NV diamond that is located within the coil assembly 1916.

Figure 20:
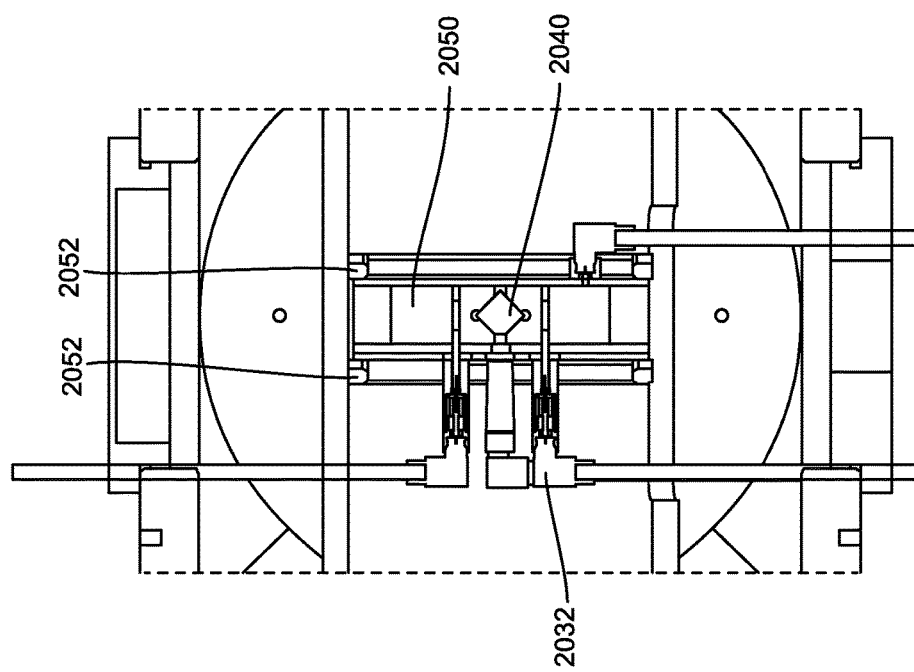
FIG. 20 is a schematic illustrating a cross section of a portion of a DNV sensor with a coil assembly in accordance with some illustrative implementations.

FIG. 20 is a schematic illustrating a cross section of a portion of a DNV sensor with a coil assembly in accordance with some illustrative implementations. In this figure, the NV diamond 2040 within the coil assembly can be seen. Light enters the edge of the NV diamond in this implementation and exits the NV diamond 2040 from two faces of the NV diamond 2040. The light the exits the NV diamond 2040 travels one of two light pipes 1914. In various implementations, at least a portion of the light pipe is located within an attenuator. The NV diamond 2040 can be held in place within the coil assembly via center mounting blocks 2050. The mounting blocks and the coil assembly can be held in place using retaining rings 2052. RF cables 2030 connect to the RF elements via RF connectors 2032 to provide an RF feed signal to the RF elements as described in greater detail below.

Figure 21:
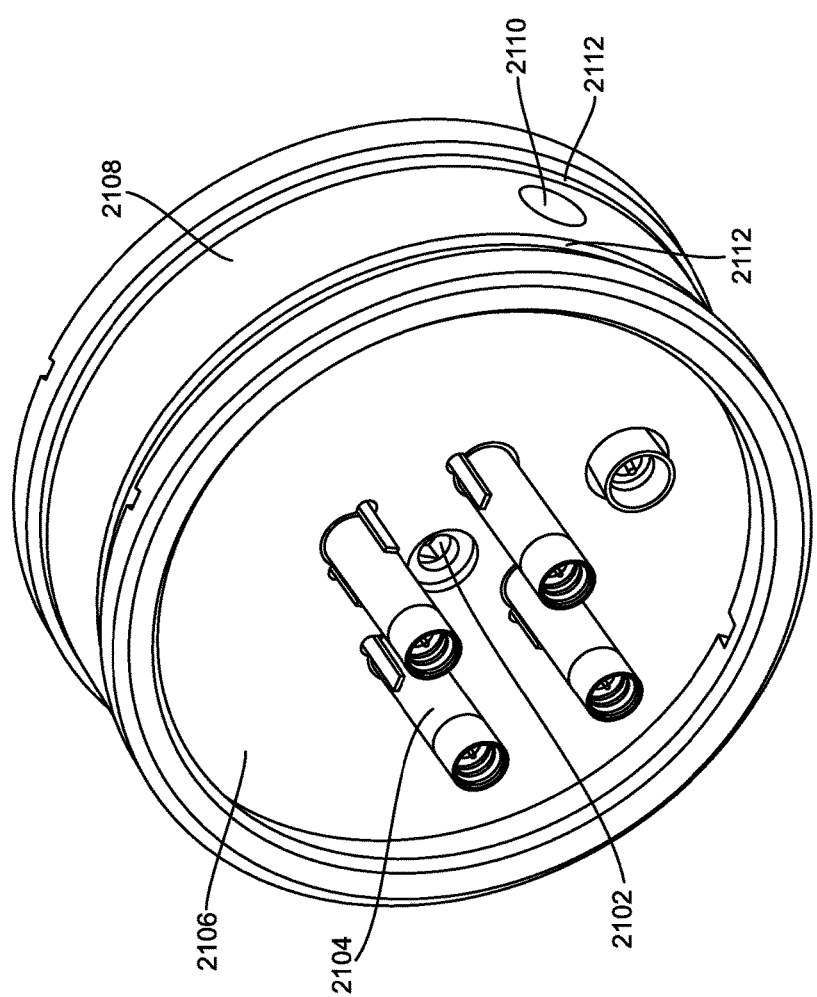
FIG. 21 is a schematic illustrating a coil assembly in accordance with some illustrative implementations.
Figure 22:
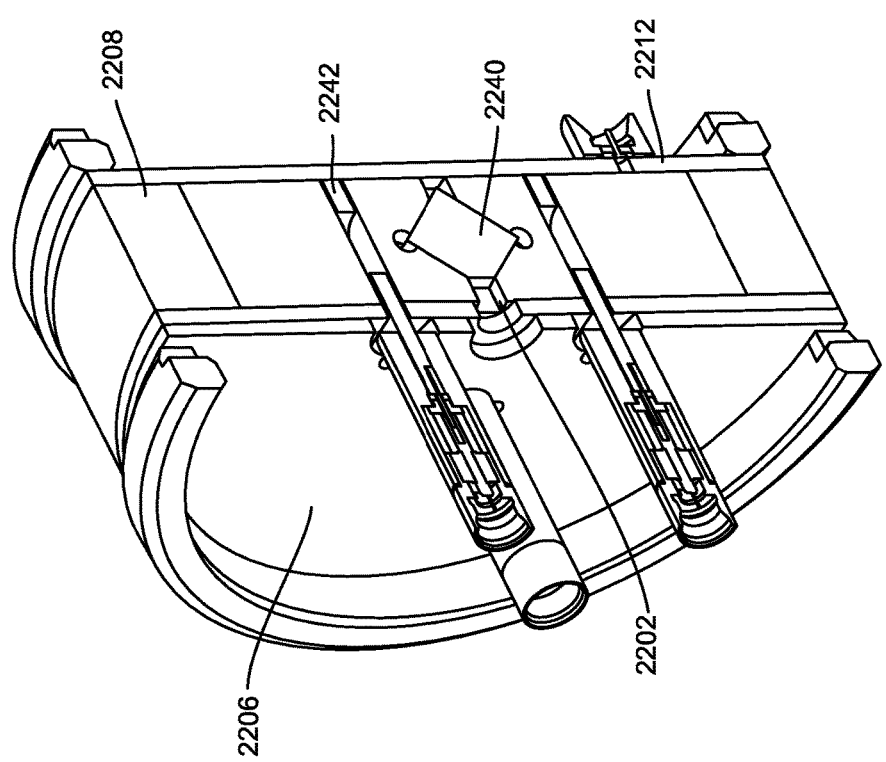
FIG. 22 is a schematic illustrating a cross section of a coil assembly in accordance with some illustrative implementations.

FIG. 21 is a schematic illustrating a coil assembly in accordance with some illustrative implementations. FIG. 22 is a schematic illustrating a cross section of a coil assembly in accordance with some illustrative implementations. FIG. 21 shows four side elements 2014 and 2242 located between the top and bottom RF elements 2112 and 2212. The center mounting blocks 2108 and 2208 and retaining plate 2106 and 2206 are also shown. As describe above, light enters the NV diamond 2240 at an edge. The light reaches the NV diamond via a light injection opening 2101 and 2202. Light exits the NV diamond 2240 substantially orthogonal to the ingress path through two light exit holes 2110. A second light exit hole is opposite of the illustrated light exit hole 2110. In FIG. 22, the second light exit hold is behind the NV diamond 2240.

Figure 23:
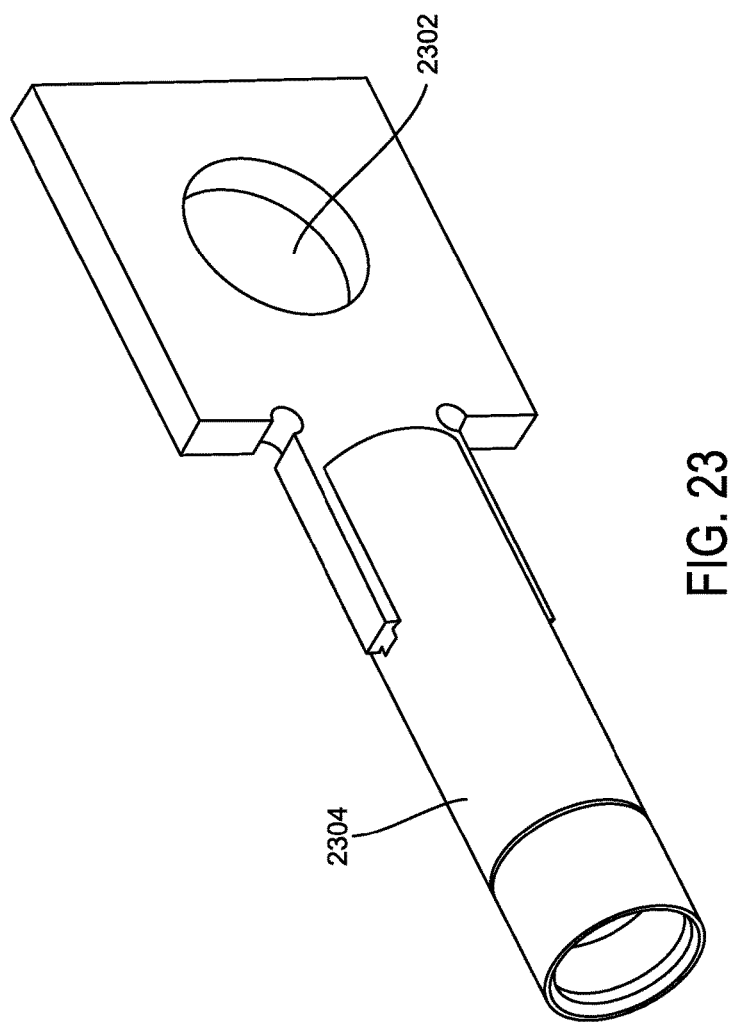
FIG. 23 is a schematic illustrating a side element of a coil assembly in accordance with some illustrative implementations.

FIG. 23 is a schematic illustrating a side element of a coil assembly in accordance with some illustrative implementations. The individual side element includes an RF connector 2304 and a light egress portion 2302. The side element, however, does not include any attachment holes. Rather, the side elements can be held in place within the coil assembly using the top and bottom elements as illustrated in FIGS. 24A and 24B.

Figure 24A:
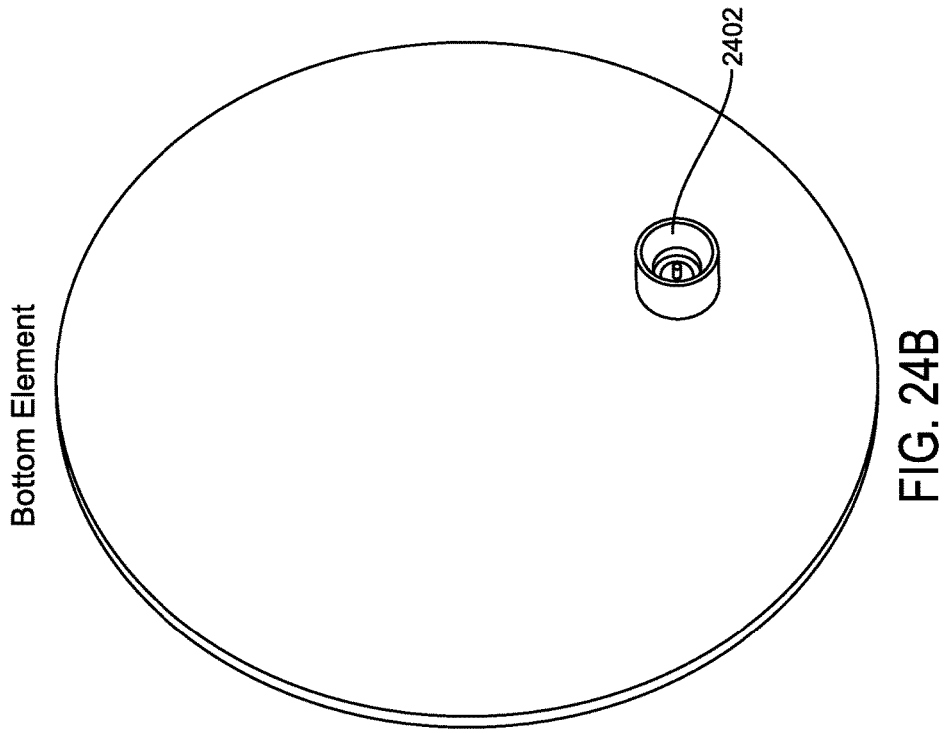
FIGS. 24A and 24B are schematics illustrating top and bottom elements of a coil assembly in accordance with some illustrative implementations.
Figure 24B:
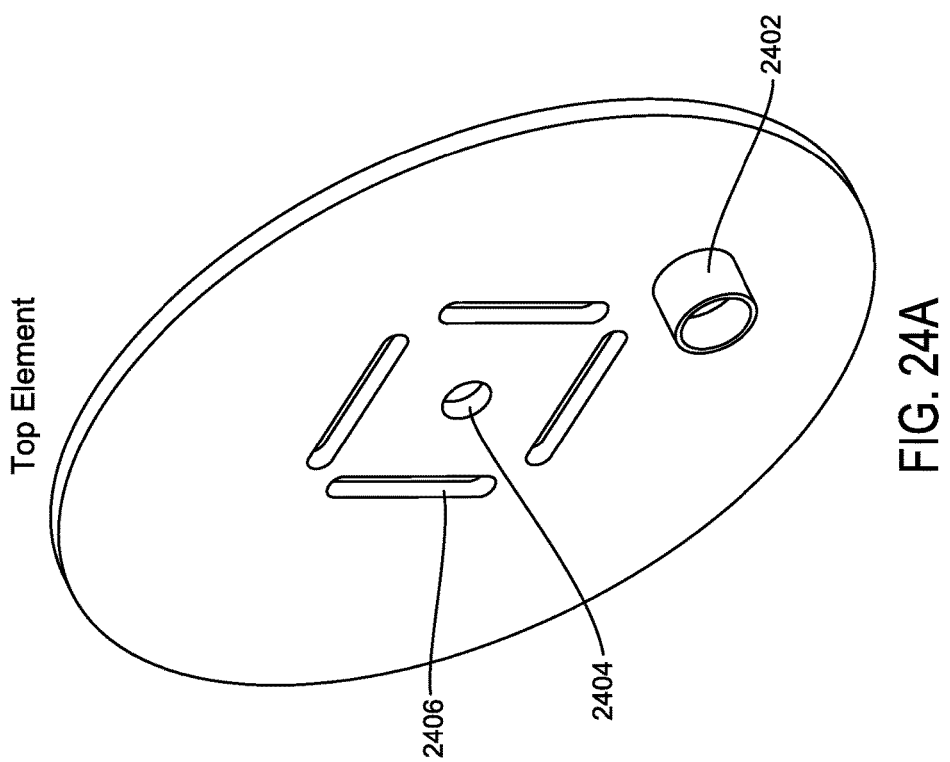

FIGS. 24A and 24B are schematics illustrating top and bottom elements of a coil assembly in accordance with some illustrative implementations. The top element includes slots 2406 for aligning and holding into position the four RF side elements. The light injection hole 2404 is also shown. RF connectors 2404 located on both the top RF element and the bottom RF element allow for separate RF feeds to be separately applied to the top and bottom RF elements.

The foregoing description is provided to enable a person skilled in the art to practice the various configurations described herein. While the subject technology has been particularly described with reference to the various figures and configurations, it should be understood that these are for illustration purposes only and should not be taken as limiting the scope of the subject technology. In some aspects, the subject technology may be used in various markets, including for example and without limitation, advanced sensors and mobile space platforms.

There may be many other ways to implement the subject technology. Various functions and elements described herein may be partitioned differently from those shown without departing from the scope of the subject technology. Various modifications to these embodiments may be readily apparent to those skilled in the art, and generic principles defined herein may be applied to other embodiments. Thus, many changes and modifications may be made to the subject technology, by one having ordinary skill in the art, without departing from the scope of the subject technology.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases A reference to an element in the singular is not intended to mean "one and only one" unless specifically stated, but rather "one or more." The term "some" refers to one or more. Underlined and/or italicized headings and subheadings are used for convenience only, do not limit the subject technology, and are not referred to in connection with the interpretation of the description of the subject technology. All structural and functional equivalents to the elements of the various embodiments described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description.

What is claimed is:

1. A magnetic field sensor assembly comprising:
   four side radio frequency (RF) elements, each side RF element comprising an RF connection;
   four side RF feed cables operably connected to one of the four side RF elements such that each side RF element is connected to one RF feed cable that provides a feed signal to the side RF element;
   a top RF element;
   a top RF element feed cable that provides a top RF feed signal to the top RF element;
   a bottom RF element;
   a bottom RF element feed cable that provides a bottom RF feed signal to the bottom RF element, wherein the four side RF side elements, the top RF element, and the bottom RF element are arranged in a cube formation; and
   a nitrogen-vacancy (NV) center diamond located within the cube formation, wherein the side RF elements, top RF element, and bottom RF element generate a microwave signal that is uniform over the NV center diamond, and wherein the side RF elements, top RF element, and bottom RF element generate a magnetic bias field to the NV center diamond.

2. The magnetic field sensor assembly of claim 1, wherein the top RF element includes a light ingress portion, wherein the bottom RF element includes a light egress portion, and wherein the cube formation includes a light path through the cube formation and through the NV center diamond via the light ingress portion and the light egress portion.

3. The magnetic field sensor assembly of claim 2, wherein light ingress into the NV diamond at a first face of the NV diamond.

4. The magnetic field sensor assembly of claim 3, wherein light egresses out of the NV diamond at a second face of the NV diamond.

5. The magnetic field sensor assembly of claim 2, further comprising a photo sensor that receives the light that egresses from the light egress portion.

6. The magnetic field sensor assembly of claim 1, wherein each feed signal is a different RF feed signal.

7. The magnetic field sensor assembly of claim 1, wherein the top RF element includes a light ingress portion, wherein a first RF side element includes a light egress portion, and wherein the cube formation includes a light path through the cube formation and through the NV center diamond via the light ingress portion and the light egress portion.

8. The magnetic field sensor assembly of claim 7, wherein a second RF side element includes a second light egress portion that forms a second light egress path.

9. The magnetic field assembly of claim 1, wherein the NV center diamond is held with the cube formation via a mounting block that contains a diamond recess and a diamond plug that holds with NV center diamond in the diamond recess.

10. A magnetic field sensor assembly comprising:
    four side radio frequency (RF) elements, each side RF element comprising an RF connection;
    four side RF feed cables operably connected to one of the four side RF elements such that each side RF element is connected to one RF feed cable that provides a feed signal to the side RF element;
    a top RF element;
    a top RF element feed cable that provides a top RF feed signal to the top RF element;
    a bottom RF element;

a bottom RF element feed cable that provides a bottom RF feed signal to the bottom RF element, wherein the four side RF side elements, the top RF element, and the bottom RF element are arranged in a column formation; and a nitrogen-vacancy (NV) center diamond located within the column formation, wherein the side RF elements, top RF element, and bottom RF element generate a microwave signal that is uniform over the NV center diamond, and wherein the side RF elements, top RF element, and bottom RF element generate a magnetic bias field to the NV center diamond.

11. The magnetic field sensor assembly of claim 10, wherein the top RF element and the bottom RF element are larger than RF side elements.

12. The magnetic field sensor assembly of claim 10, wherein the top RF element includes a light ingress portion, wherein the bottom RF element includes a light egress portion, and wherein the column formation includes a light path through the column formation and through the NV center diamond via the light ingress portion and the light egress portion.

13. The magnetic field sensor assembly of claim 12, wherein light ingress into the NV diamond at a first face of the NV diamond.

14. The magnetic field sensor assembly of claim 13, wherein light egresses out of the NV diamond at a second face of the NV diamond.

15. The magnetic field sensor assembly of claim 12, further comprising a photo sensor that receives the light that egresses from the light egress portion.

16. The magnetic field sensor assembly of claim 10, wherein each feed signal is a different RF feed signal.

17. The magnetic field sensor assembly of claim 10, wherein the top RF element includes a light ingress portion, wherein a first RF side element includes a light egress portion, and wherein the column formation includes a light path through the column formation and through the NV center diamond via the light ingress portion and the light egress portion.

18. The magnetic field sensor assembly of claim 17, wherein a second RF side element includes a second light egress portion that forms a second light egress path.

19. The magnetic field assembly of claim 10, wherein the NV center diamond is held with the column formation via a mounting block that contains a diamond recess and a diamond plug that holds with NV center diamond in the diamond recess.

20. The magnetic field assembly of claim 10, wherein the four RF side elements are held in place via the top RF element and the bottom RF element.

21. The magnetic field assembly of claim 10, wherein the top RF element comprises four side element alignment portions that align the four side RF elements within the column formation.

* * * * *

UNITED STATES PATENT AND TRADEMARK OFFICE
CERTIFICATE OF CORRECTION

PATENT NO.        : 9,551,763 B1                          Page 1 of 1
APPLICATION NO.   : 15/003298
DATED             : January 24, 2017
INVENTOR(S)       : Joseph W. Hahn et al.

It is certified that error appears in the above-identified patent and that said Letters Patent is hereby corrected as shown below:

In the Claims

In Claim 3, Column 12, Line 33:
Delete "ingress" and insert --ingresses--, therefore.

In Claim 9, Column 12, Line 55:
Delete "with" and insert --the--, therefore.

In Claim 13, Column 13, Line 24:
Delete "ingress" and insert --ingresses--, therefore.

In Claim 19, Column 14, Line 19:
Delete "with" and insert --the--, therefore.

Signed and Sealed this
Twenty-fifth Day of April, 2017

Michelle K. Lee
*Director of the United States Patent and Trademark Office*